(12) United States Patent
Dong et al.

(10) Patent No.: US 11,380,709 B2
(45) Date of Patent: Jul. 5, 2022

(54) THREE DIMENSIONAL FERROELECTRIC MEMORY

(71) Applicant: SANDISK TECHNOLOGIES LLC, Addison, TX (US)

(72) Inventors: Yingda Dong, Los Altos, CA (US); James Kai, Santa Clara, CA (US); Christopher J. Petti, Mountain View, CA (US)

(73) Assignee: SanDisk Technologies LLC, Addison, TX (US)

( * ) Notice: Subject to any disclaimer, the term of this patent is extended or adjusted under 35 U.S.C. 154(b) by 197 days.

(21) Appl. No.: 16/558,712

(22) Filed: Sep. 3, 2019

(65) Prior Publication Data
US 2020/0075631 A1 Mar. 5, 2020

Related U.S. Application Data

(60) Provisional application No. 62/726,518, filed on Sep. 4, 2018.

(51) Int. Cl.
| | | |
|---|---|---|
| *H01L 21/02* | (2006.01) | |
| *H01L 21/00* | (2006.01) | |
| *H01L 27/11597* | (2017.01) | |
| *H01L 27/1159* | (2017.01) | |
| *G11C 11/22* | (2006.01) | |
| *H01L 29/78* | (2006.01) | |
| *H01L 29/66* | (2006.01) | |
| *H01L 29/51* | (2006.01) | |
| *H01L 29/786* | (2006.01) | |

(52) U.S. Cl.
CPC ...... *H01L 27/11597* (2013.01); *G11C 11/223* (2013.01); *H01L 27/1159* (2013.01); *H01L 29/516* (2013.01); *H01L 29/6684* (2013.01); *H01L 29/7827* (2013.01); *H01L 29/7869* (2013.01); *H01L 29/78391* (2014.09); *G11C 11/2255* (2013.01); *G11C 11/2257* (2013.01); *G11C 11/2273* (2013.01); *G11C 11/2275* (2013.01)

(58) Field of Classification Search
CPC .......... H01L 27/11597; H01L 27/1159; H01L 27/11507; H01L 29/516; H01L 29/7869; H01L 29/6684; H01L 27/5114; H01L 27/7827; H01L 29/78391; G11C 11/223; G11C 7/18
See application file for complete search history.

(56) References Cited

U.S. PATENT DOCUMENTS

| | | | |
|---|---|---|---|
| 2011/0266604 A1* | 11/2011 | Kim | H01L 27/11578 257/314 |
| 2014/0340952 A1* | 11/2014 | Ramaswamy | G11C 11/223 365/51 |
| 2015/0311217 A1* | 10/2015 | Chavan | H01L 27/10876 257/295 |

(Continued)

*Primary Examiner* — Alonzo Chambliss
(74) *Attorney, Agent, or Firm* — Vierra Magen Marcus LLP

(57) ABSTRACT

A memory element is provided that includes a portion of a bit line plug, a portion of a source line plug, a portion of a word line, a portion of a vertical semiconductor pillar disposed between the bit line plug, the source line plug and adjacent the word line, and a gate oxide including a ferroelectric material disposed between the vertical semiconductor pillar and the word line.

20 Claims, 41 Drawing Sheets

(56) References Cited

U.S. PATENT DOCUMENTS

2016/0118404 A1* 4/2016 Peng .................. H01L 27/1159
                                                      257/295
2019/0237470 A1* 8/2019 Mine ................. H01L 27/11597

* cited by examiner

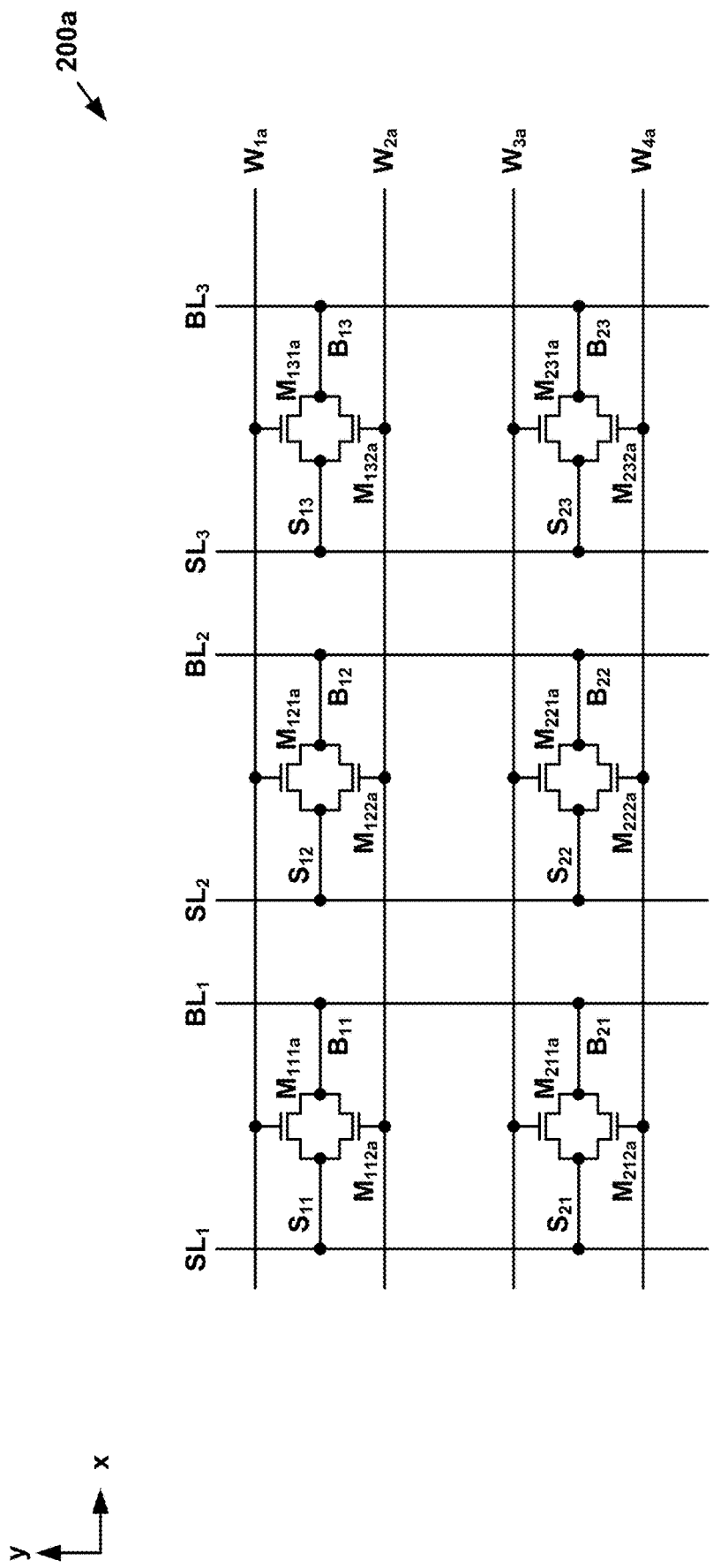
FIG. 2B1

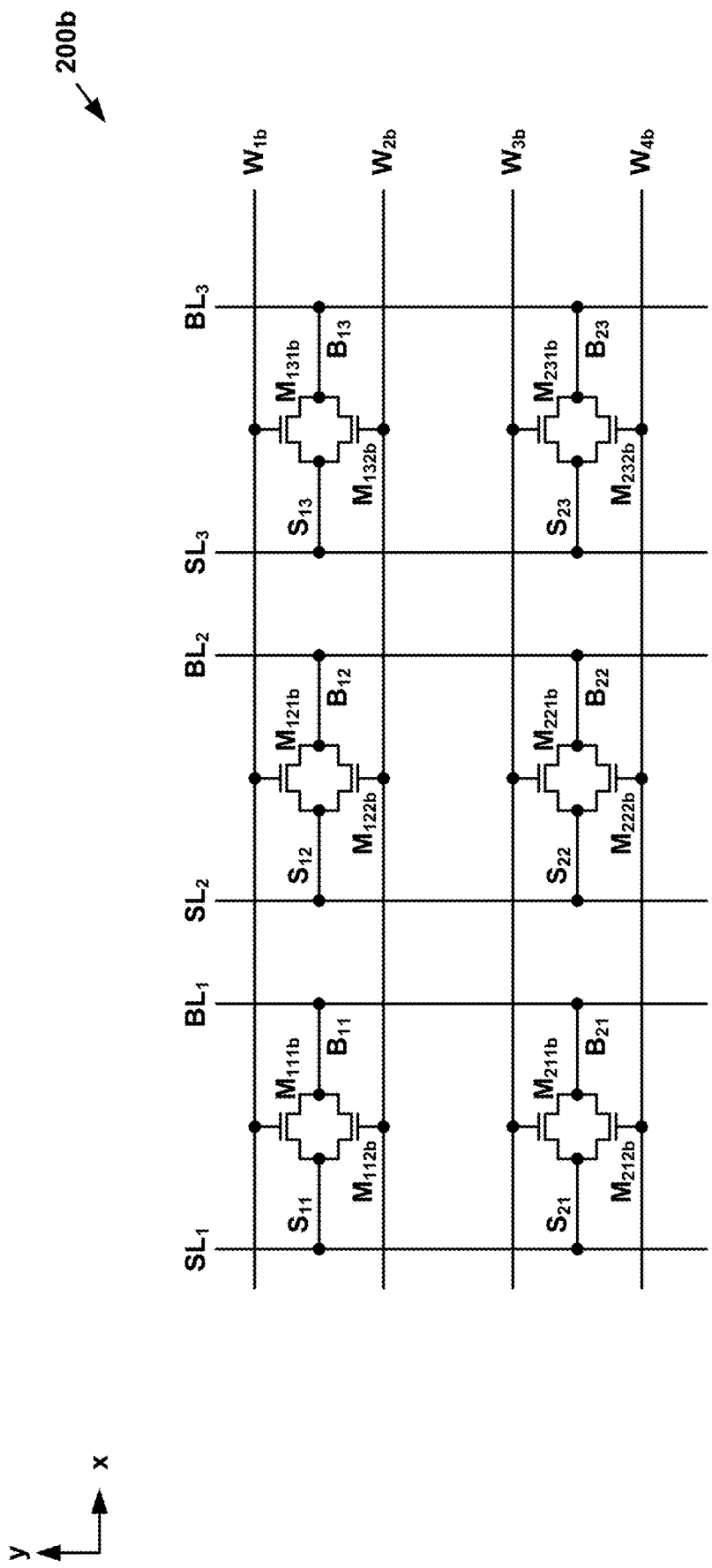
FIG. 2B2

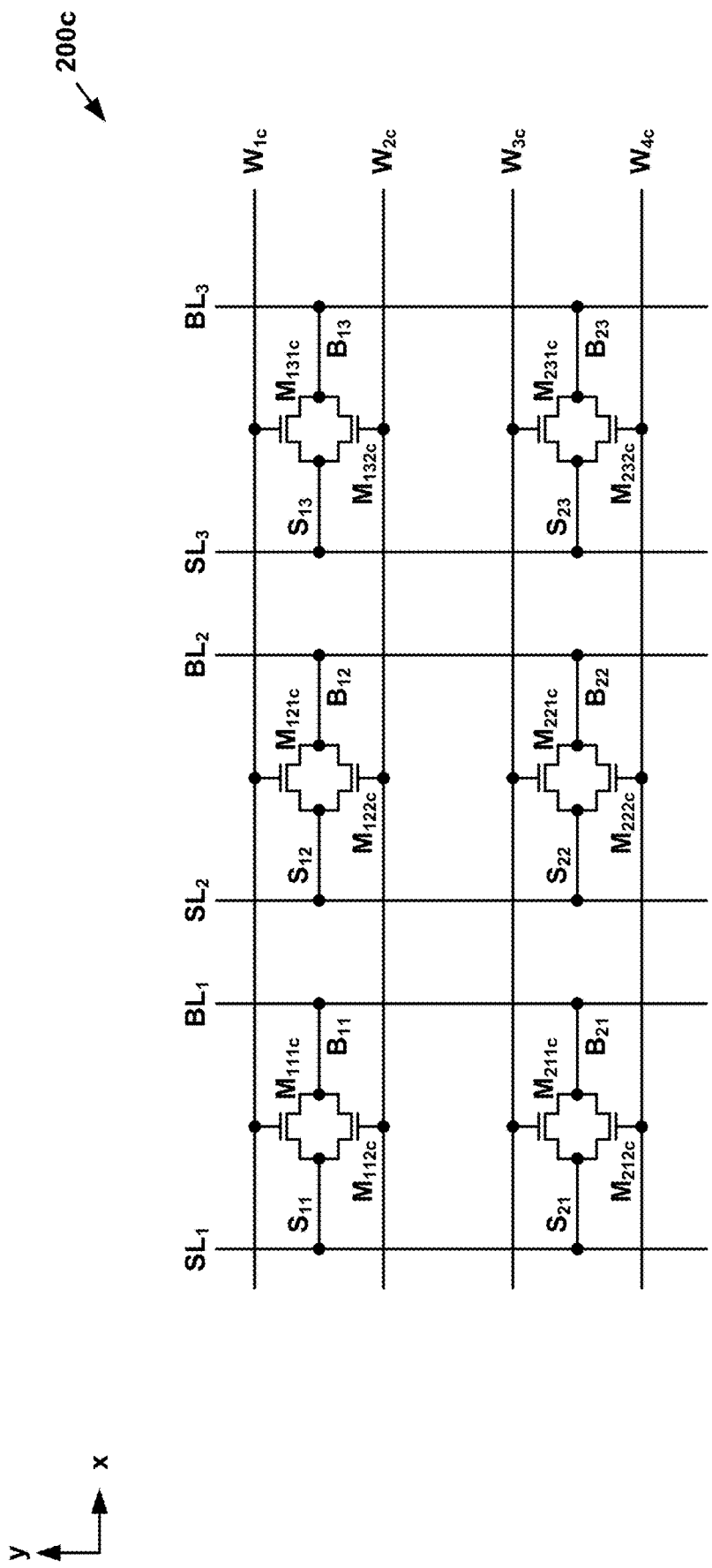
FIG. 2B3

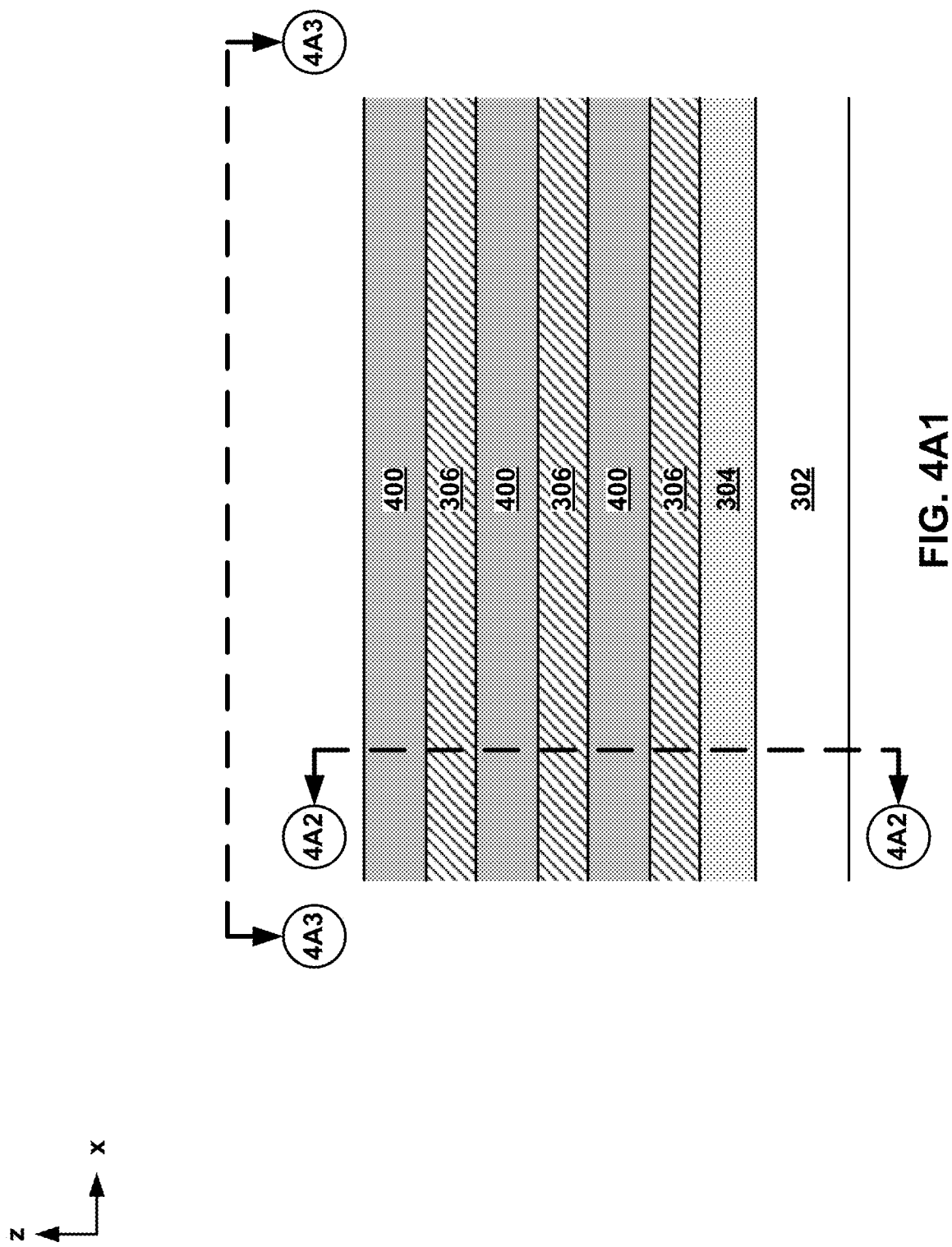

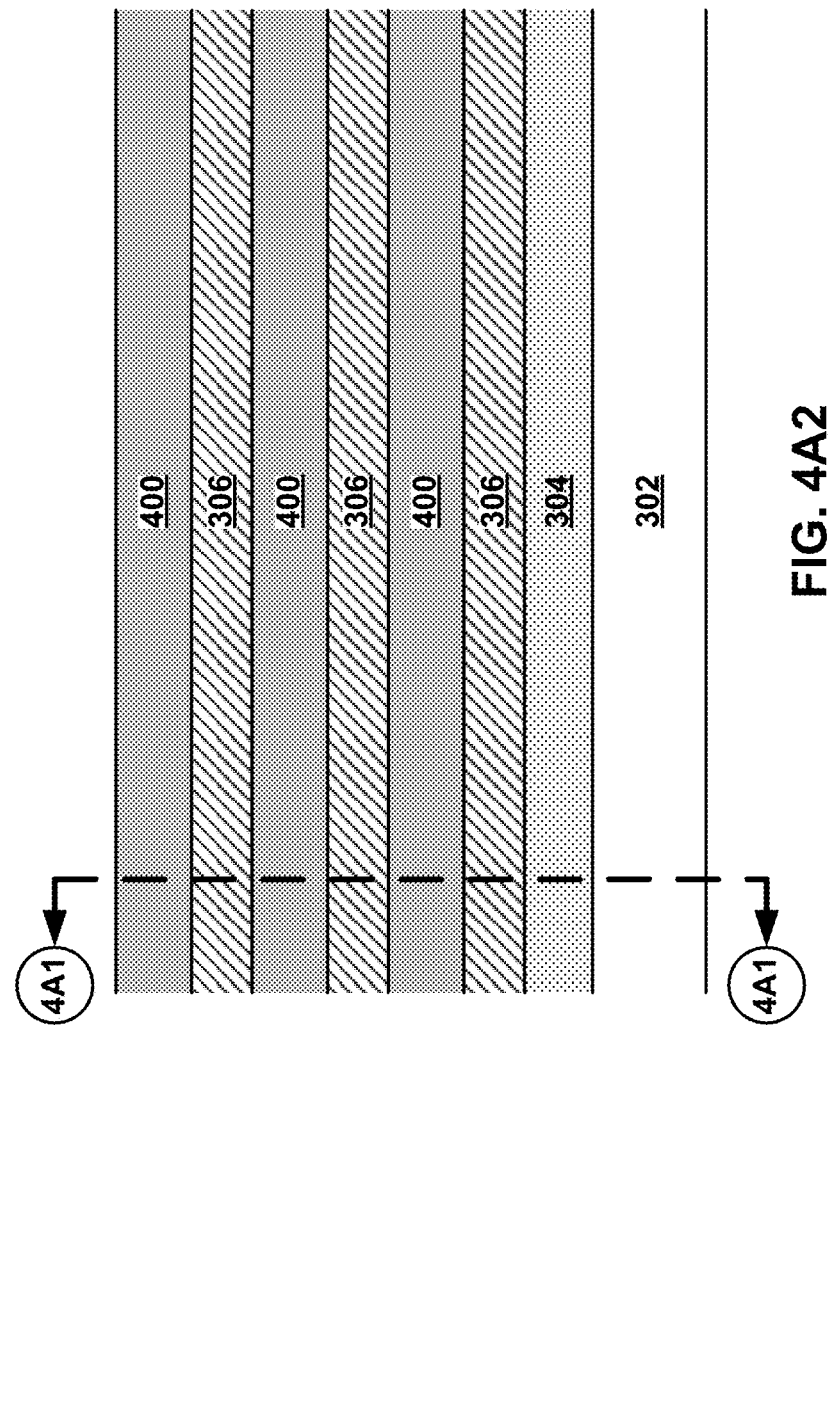

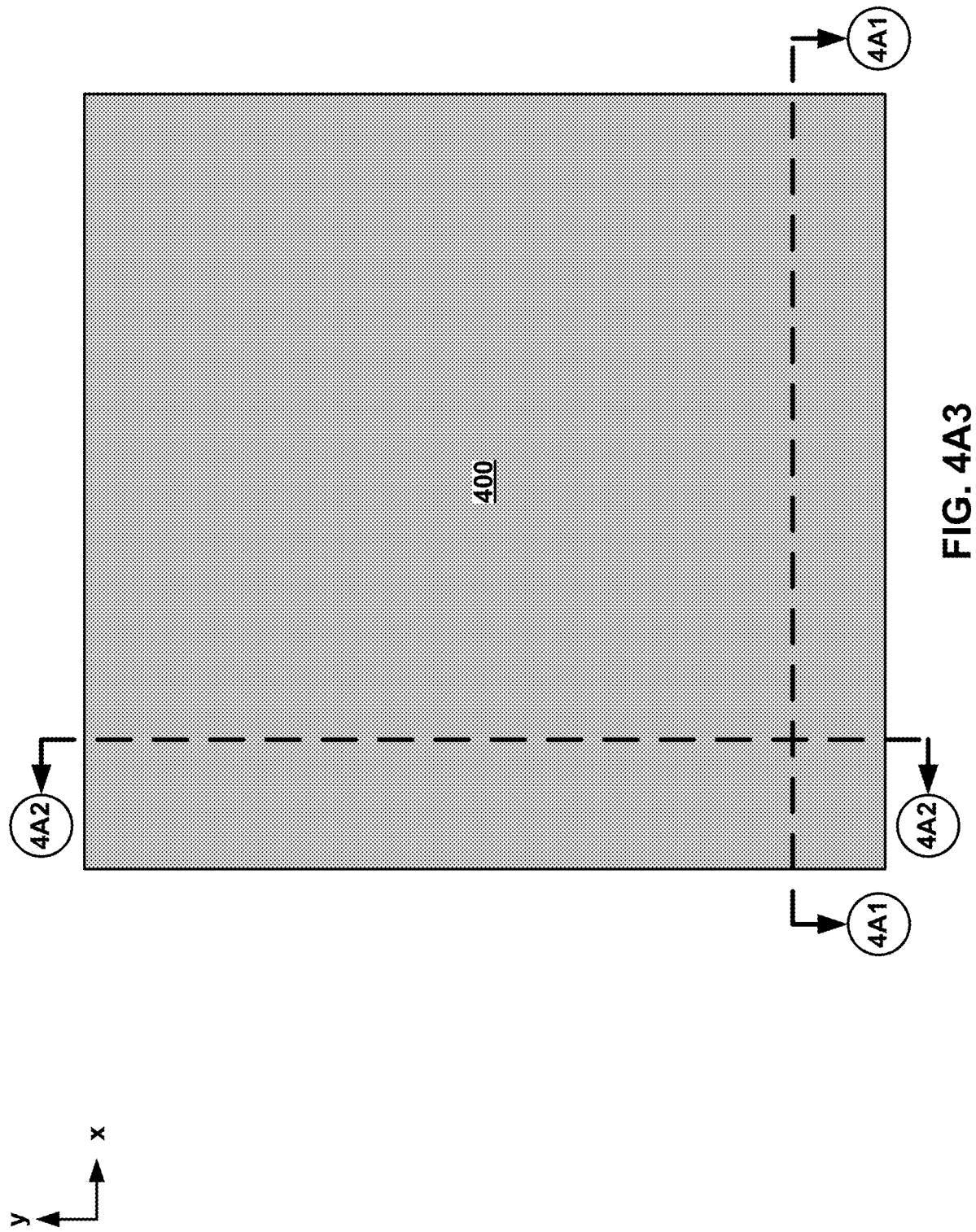

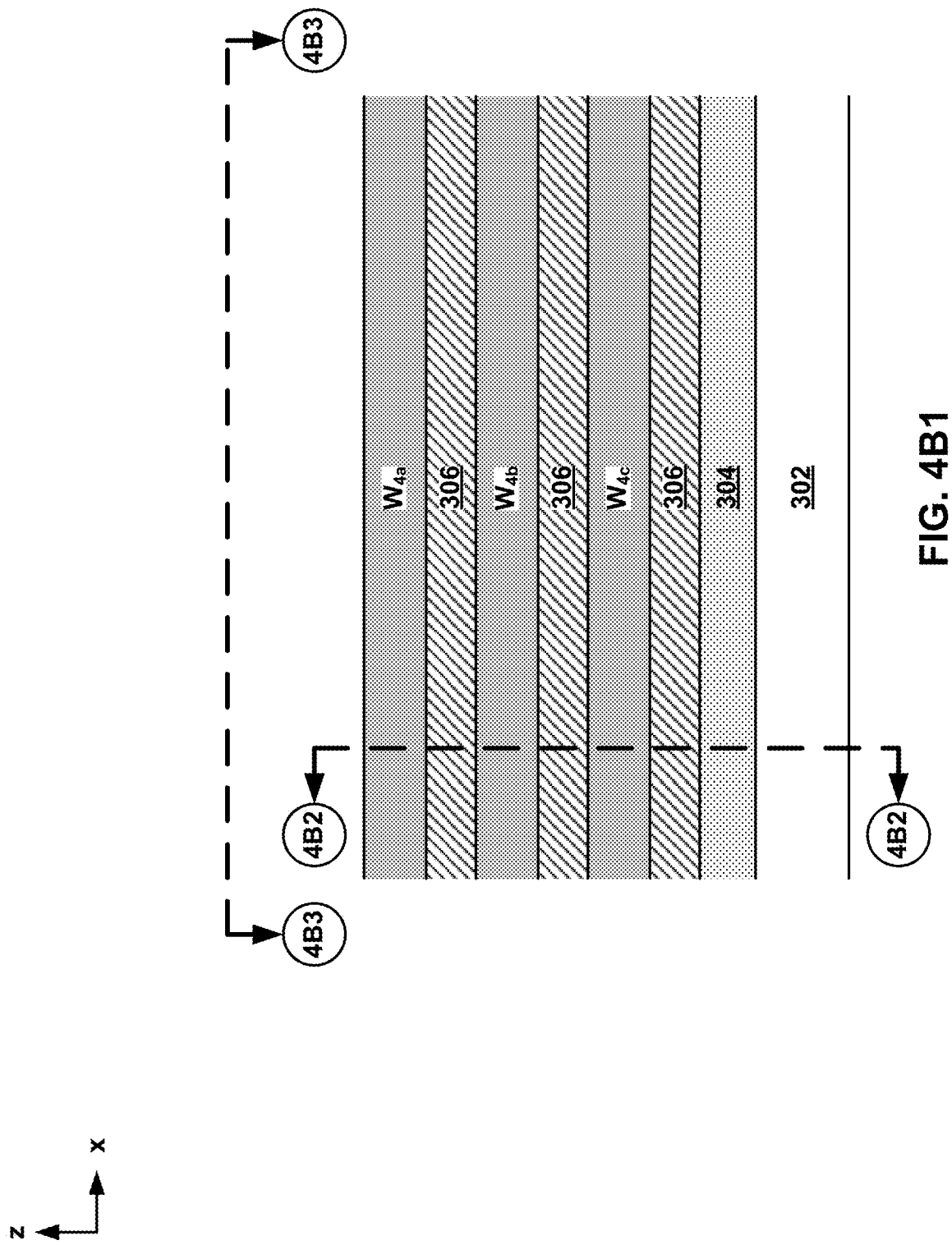

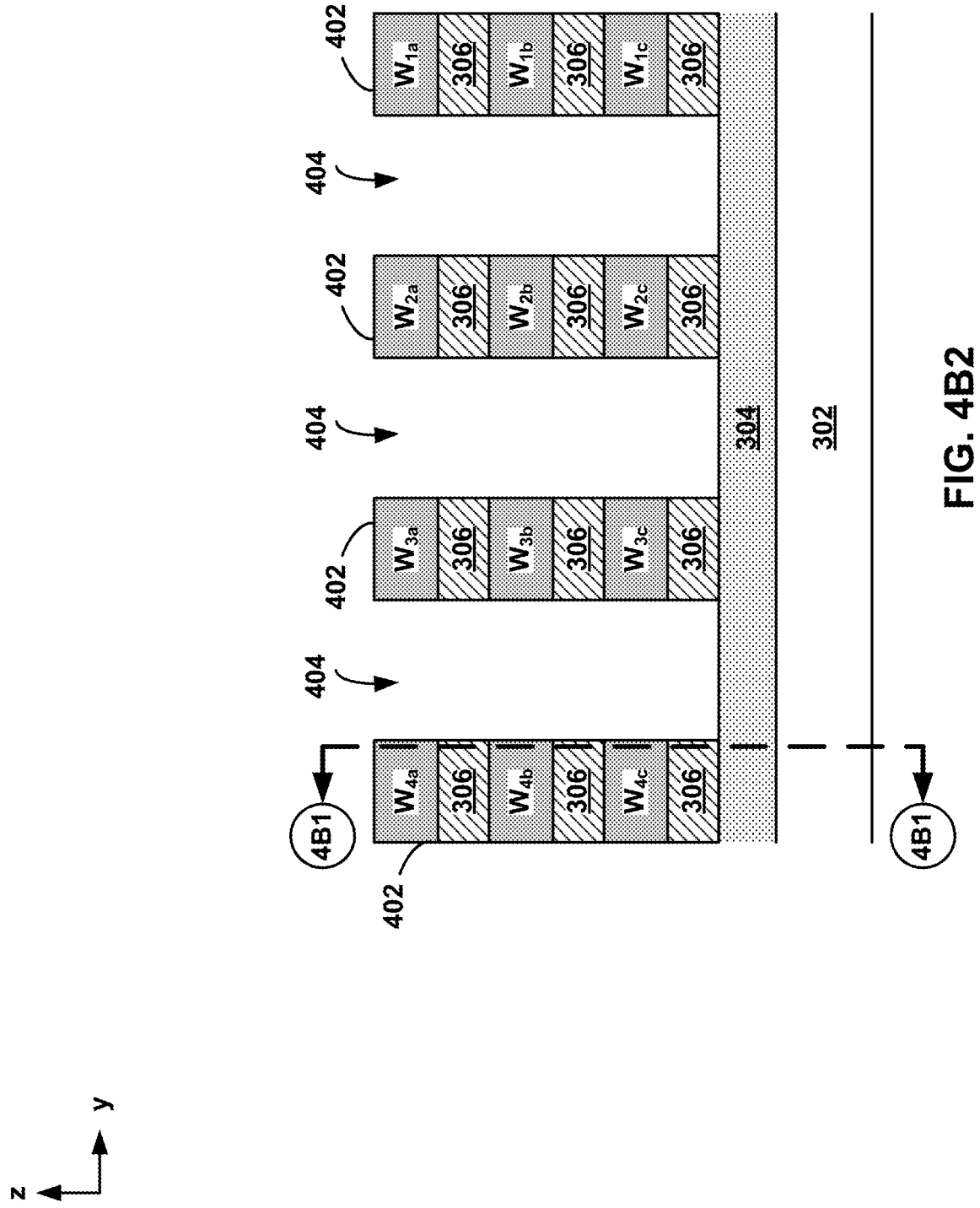
FIG. 4B2

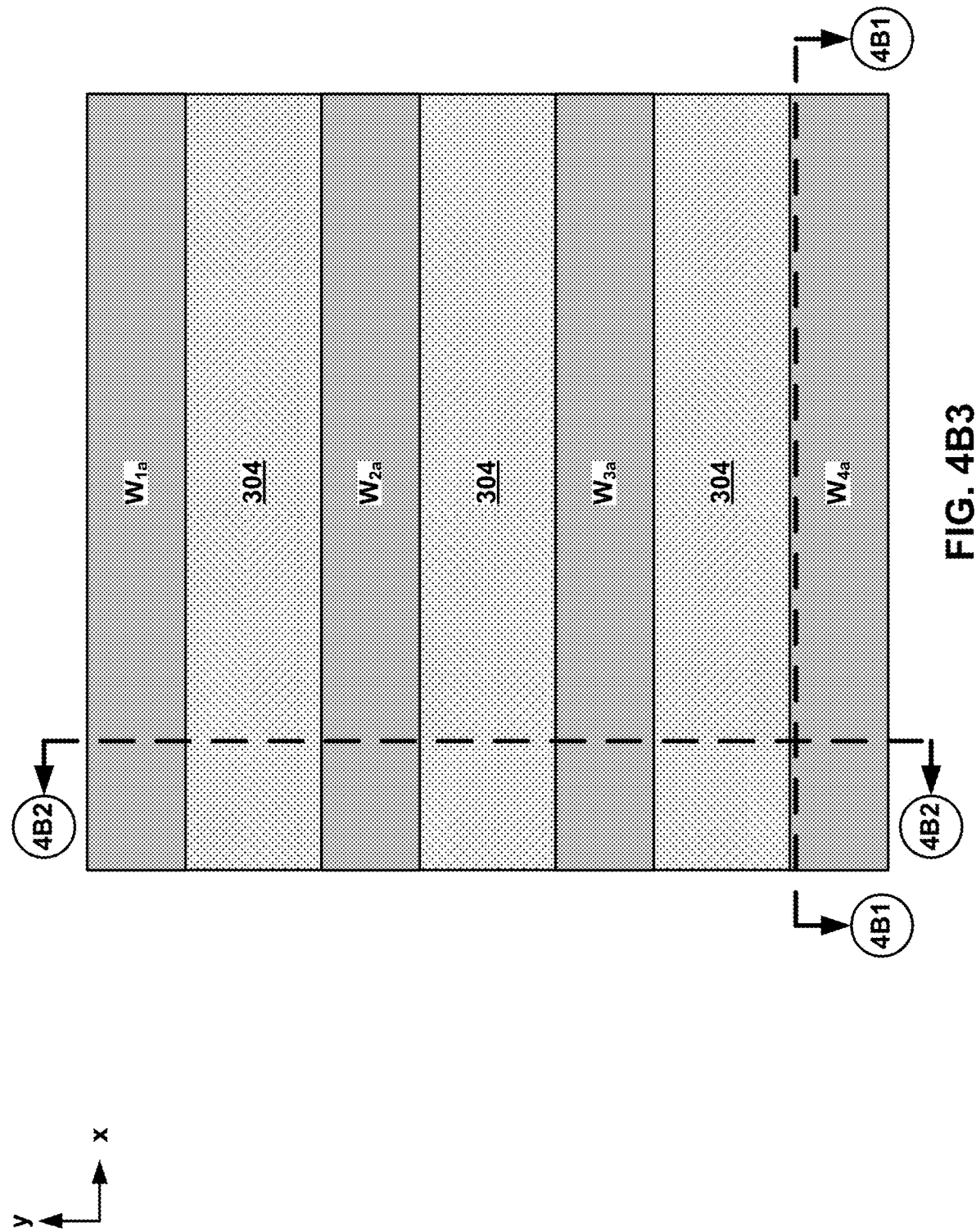

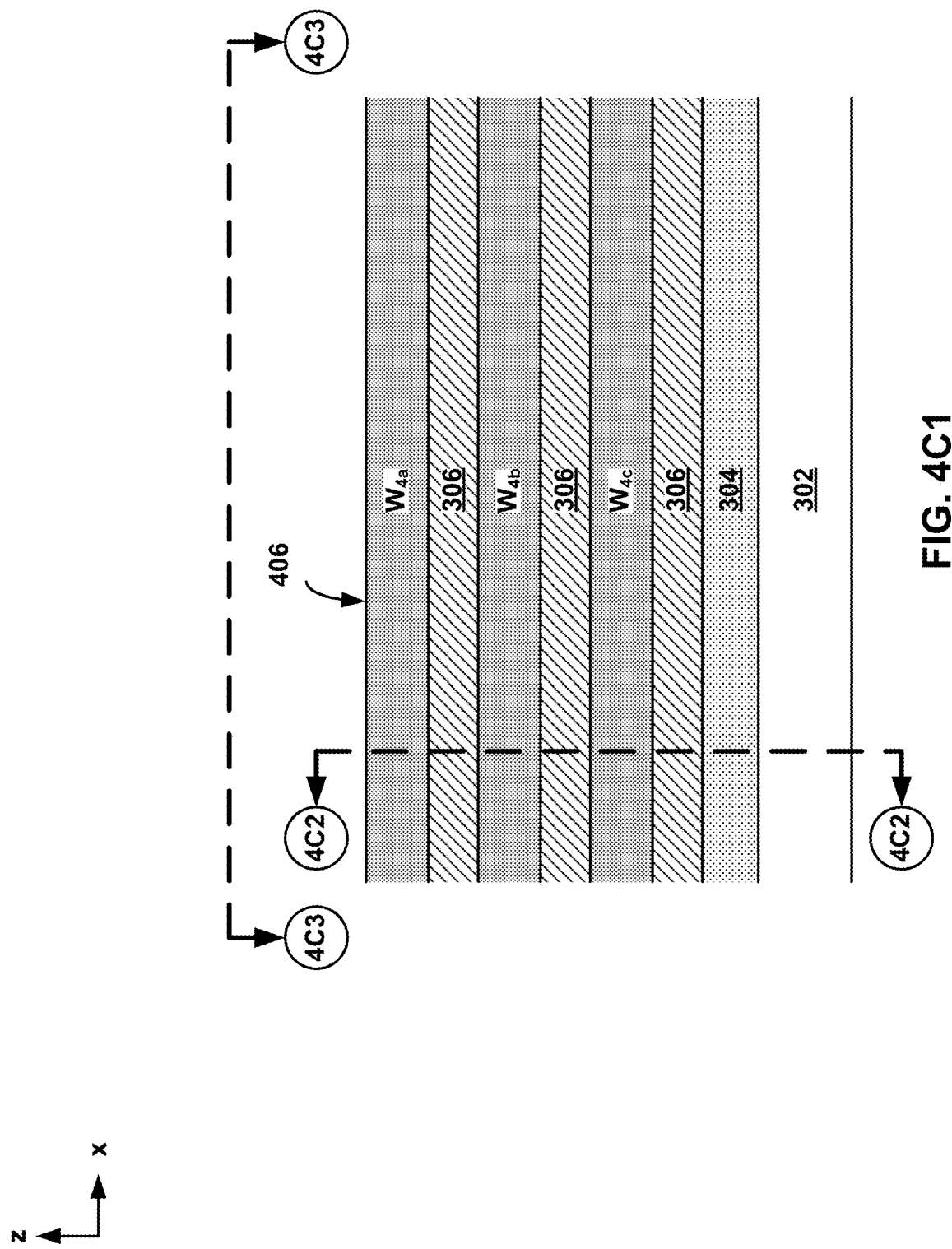

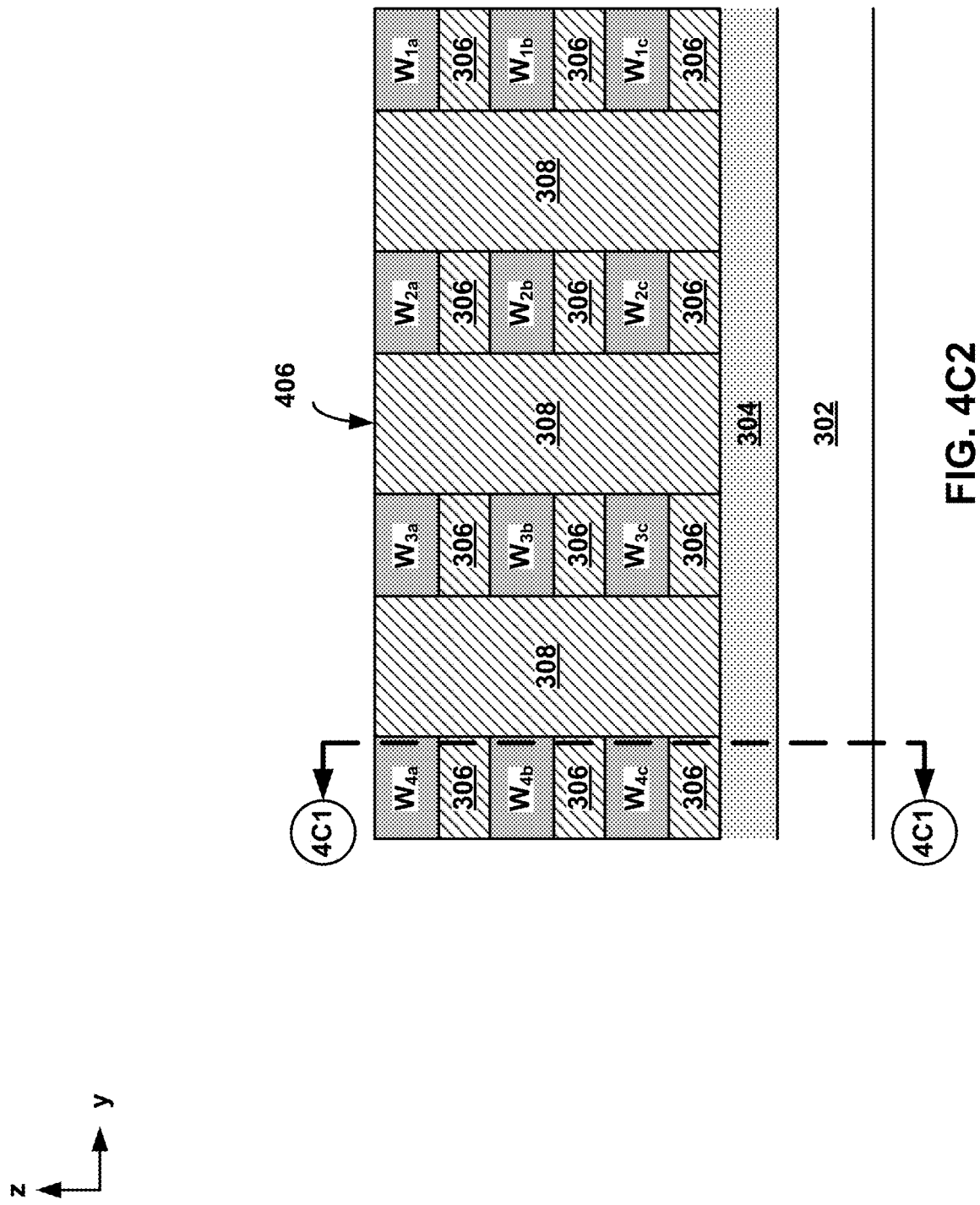
FIG. 4C2

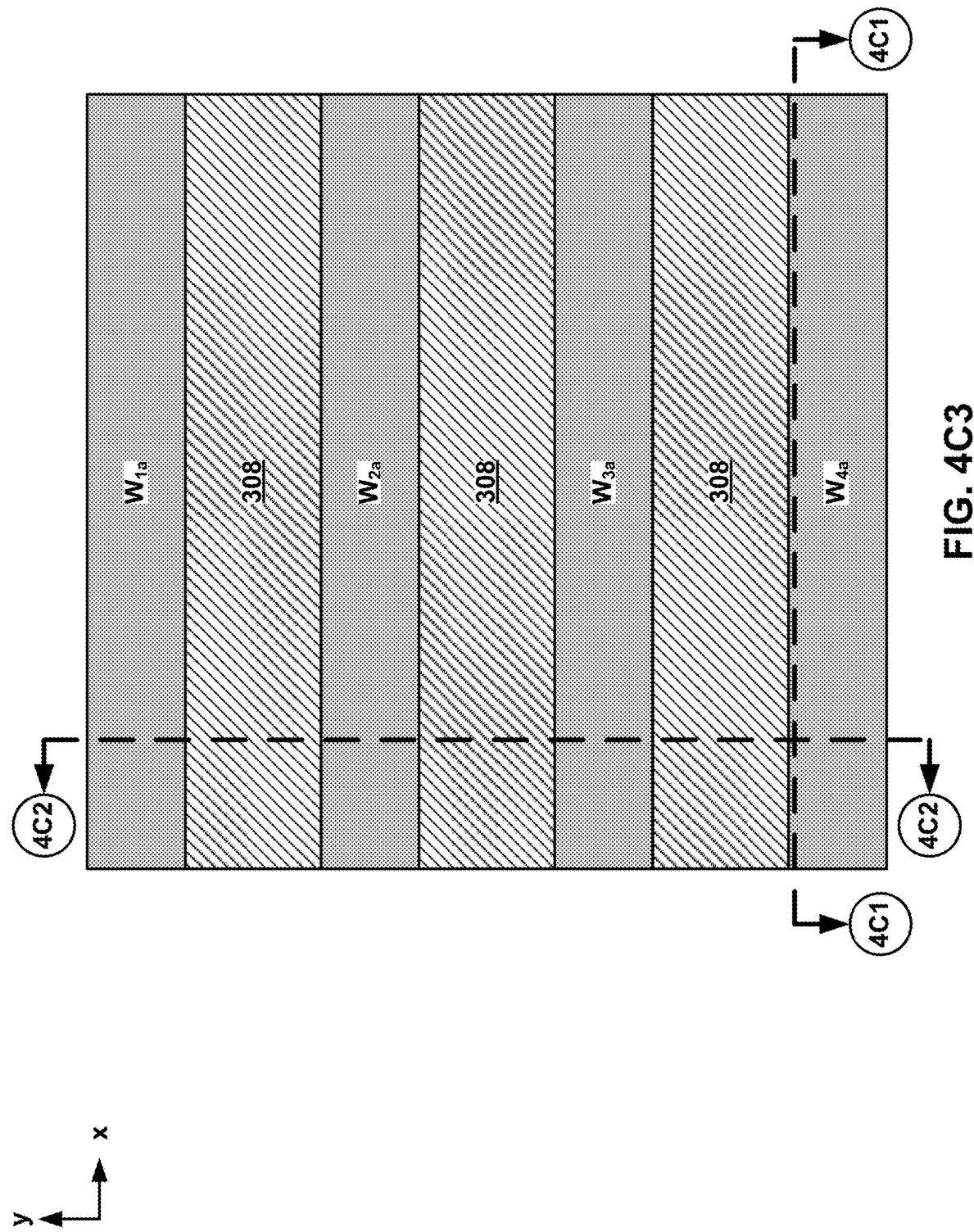
FIG. 4C3

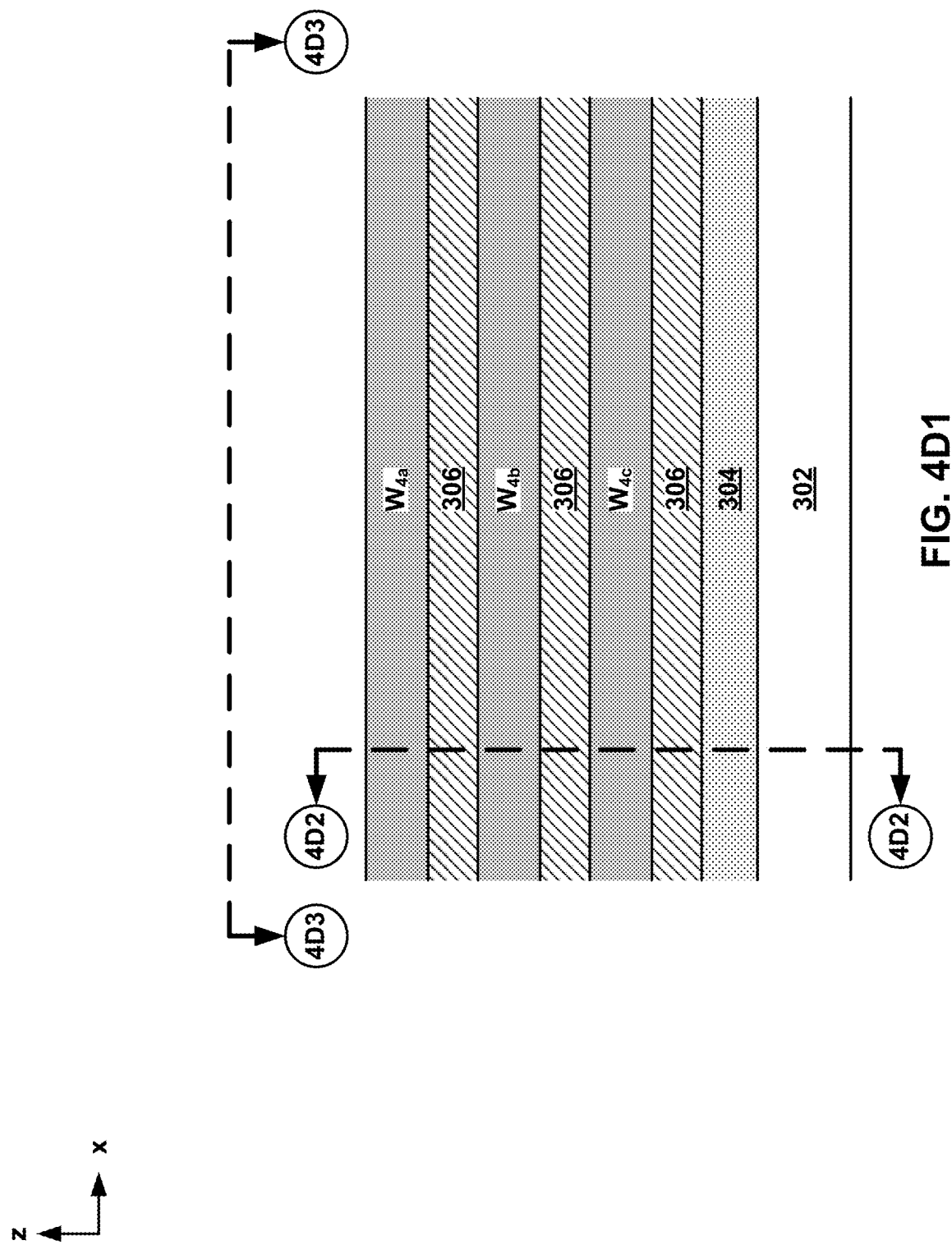

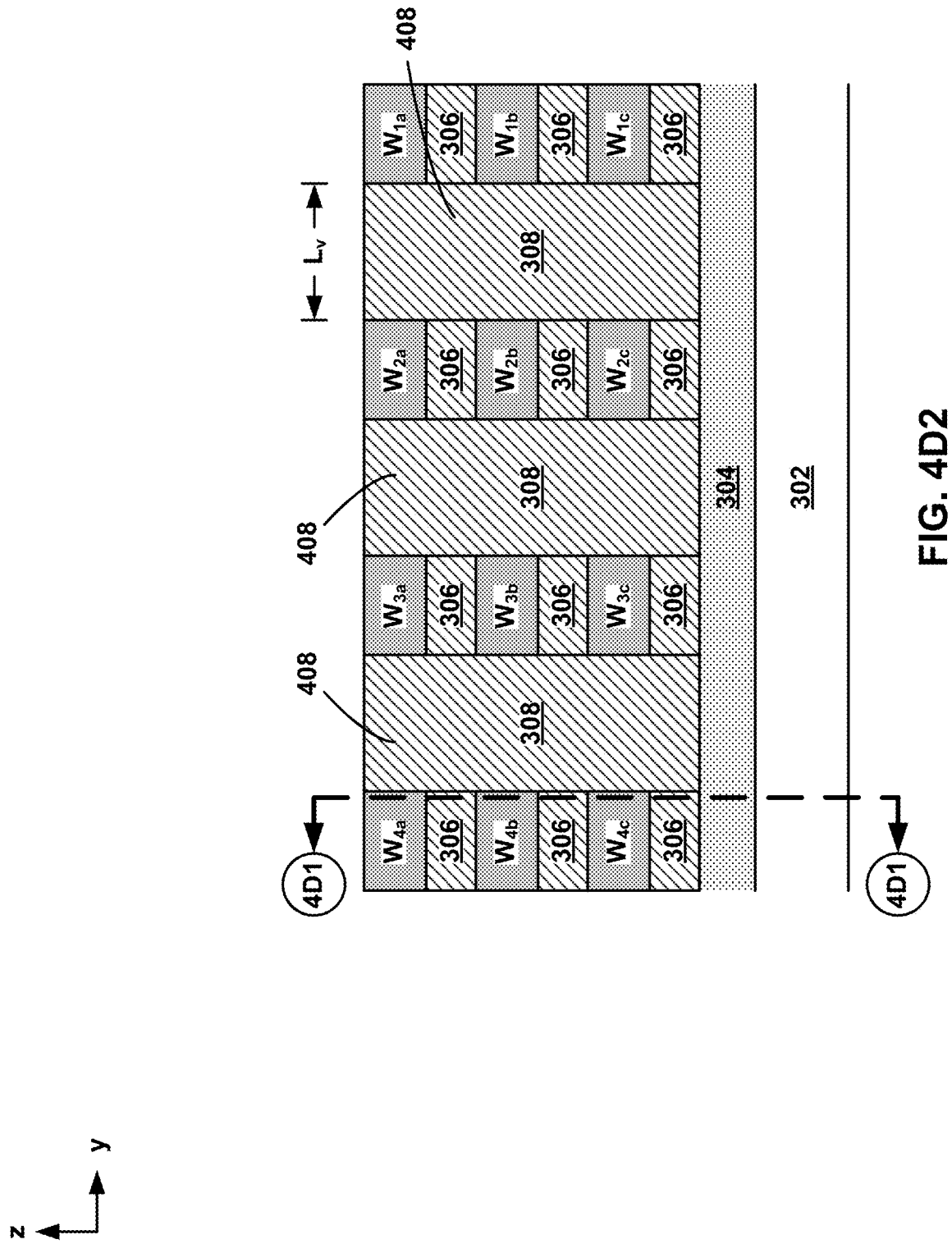
FIG. 4D2

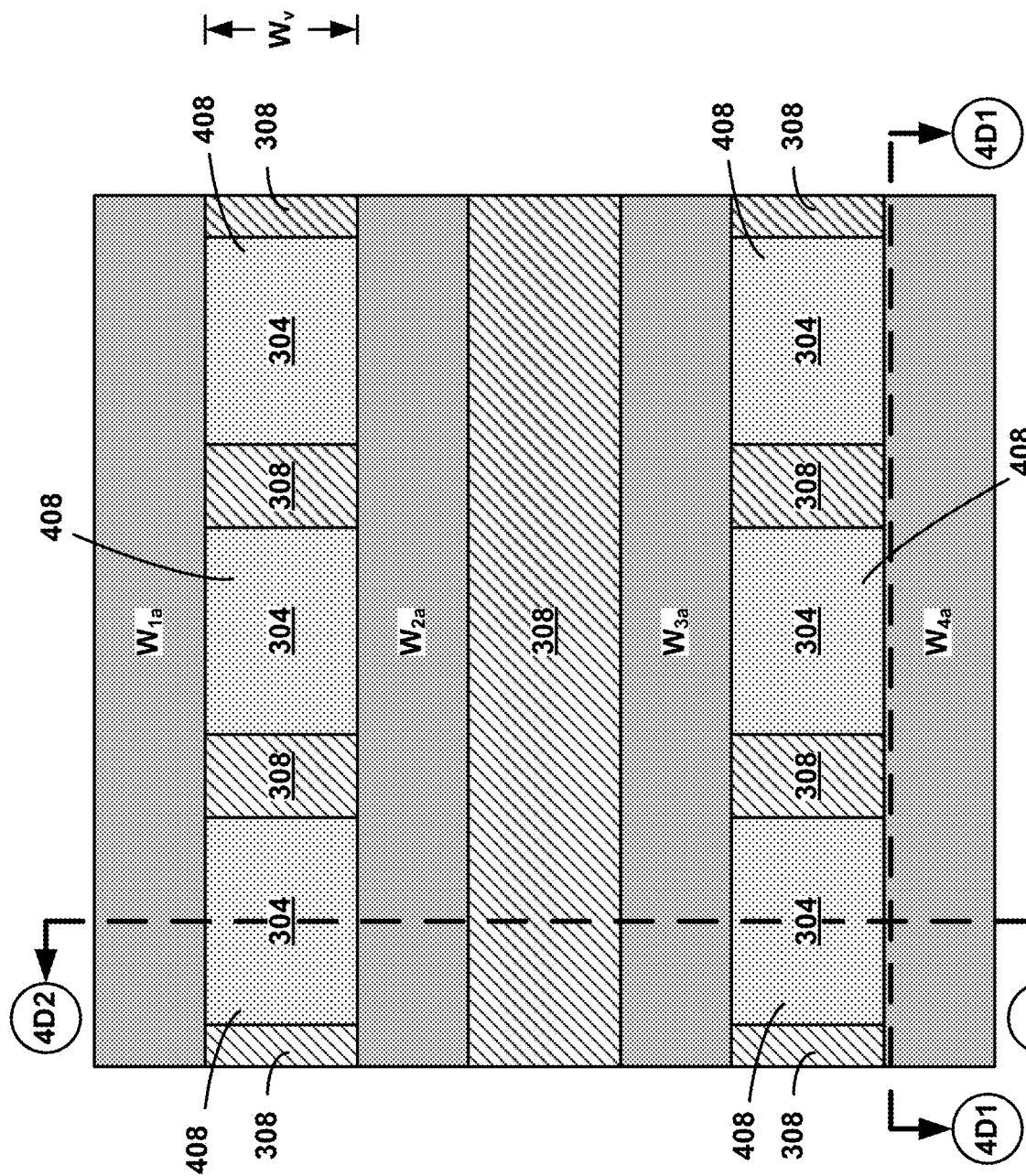
FIG. 4D3

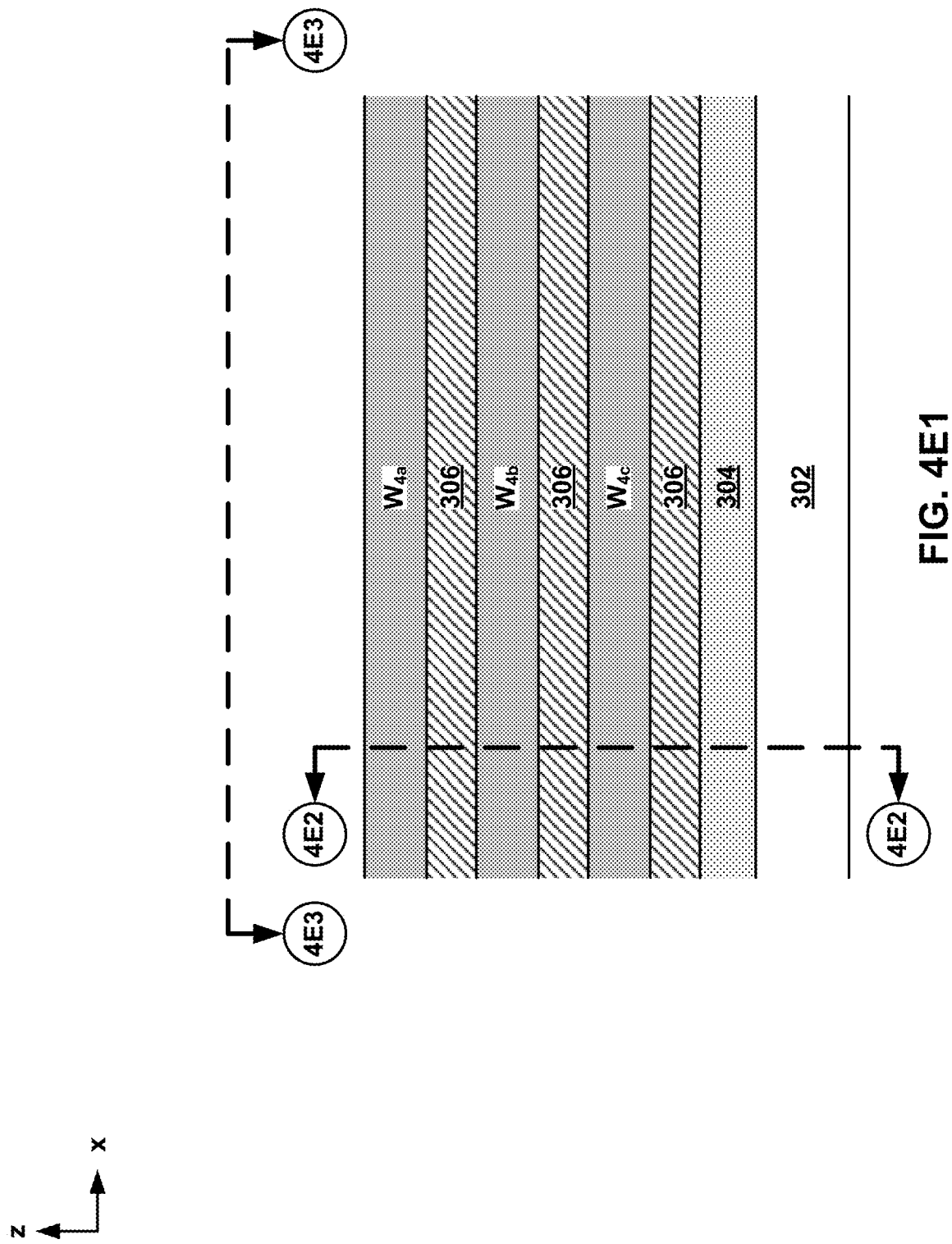

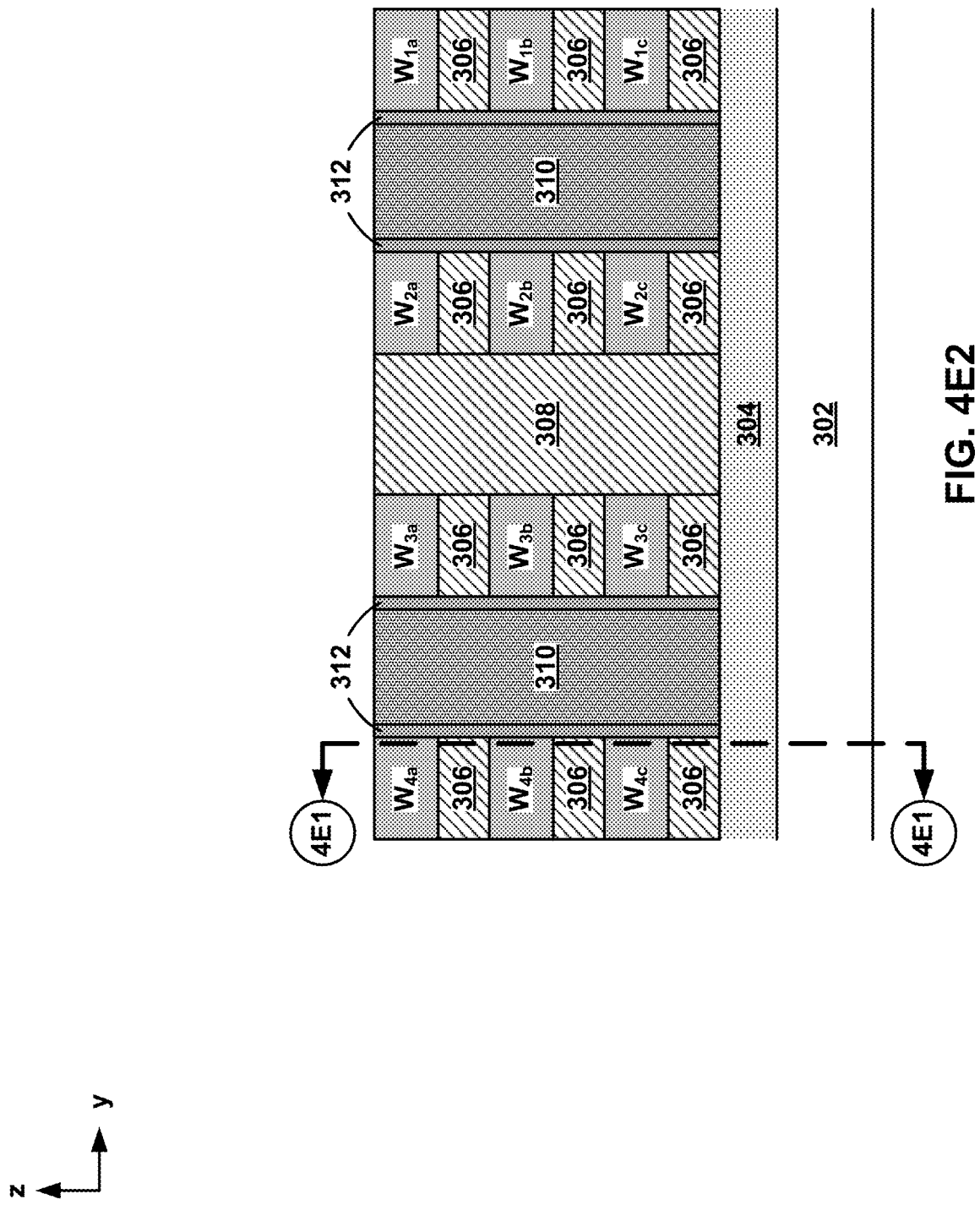
FIG. 4E2

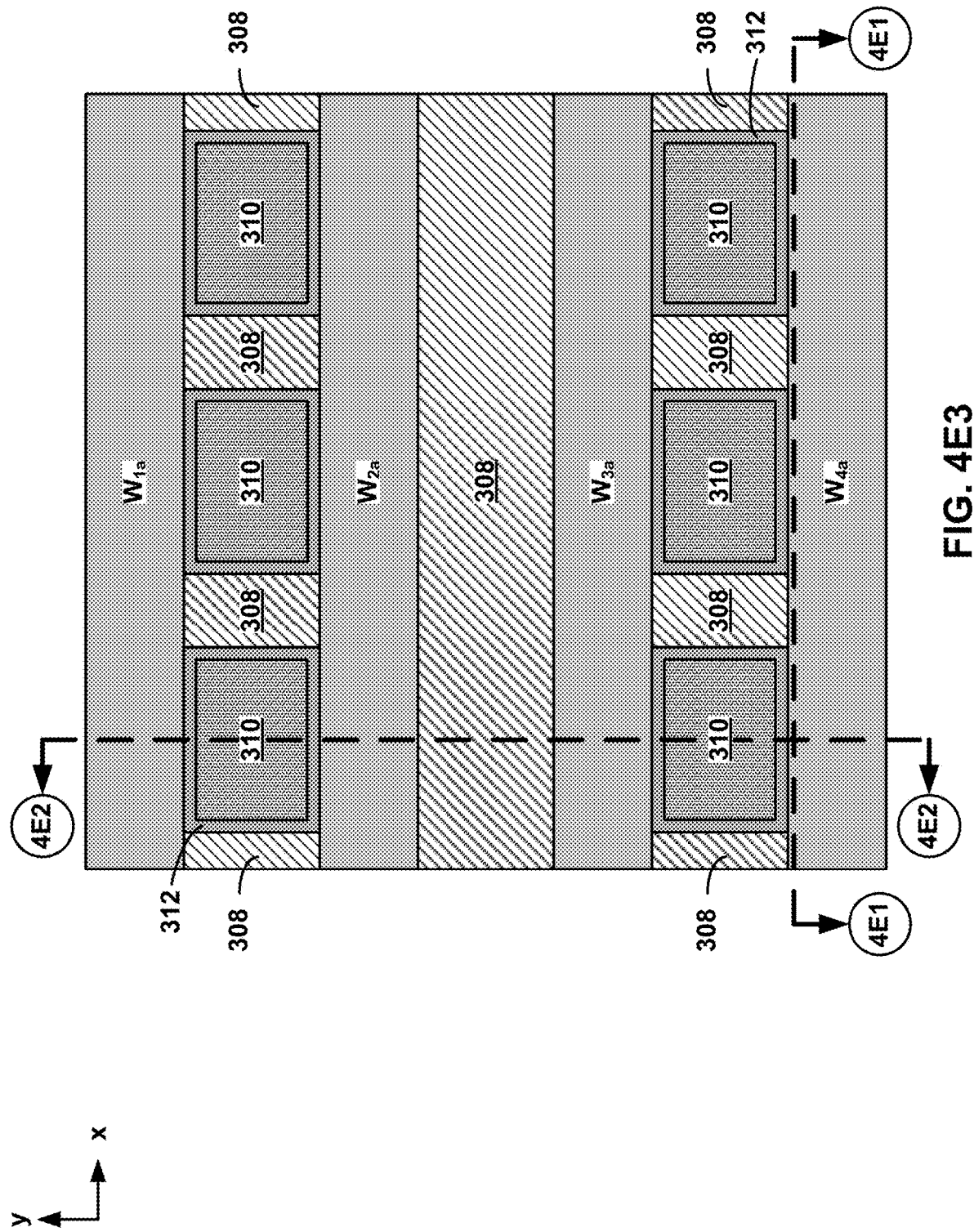
FIG. 4E3

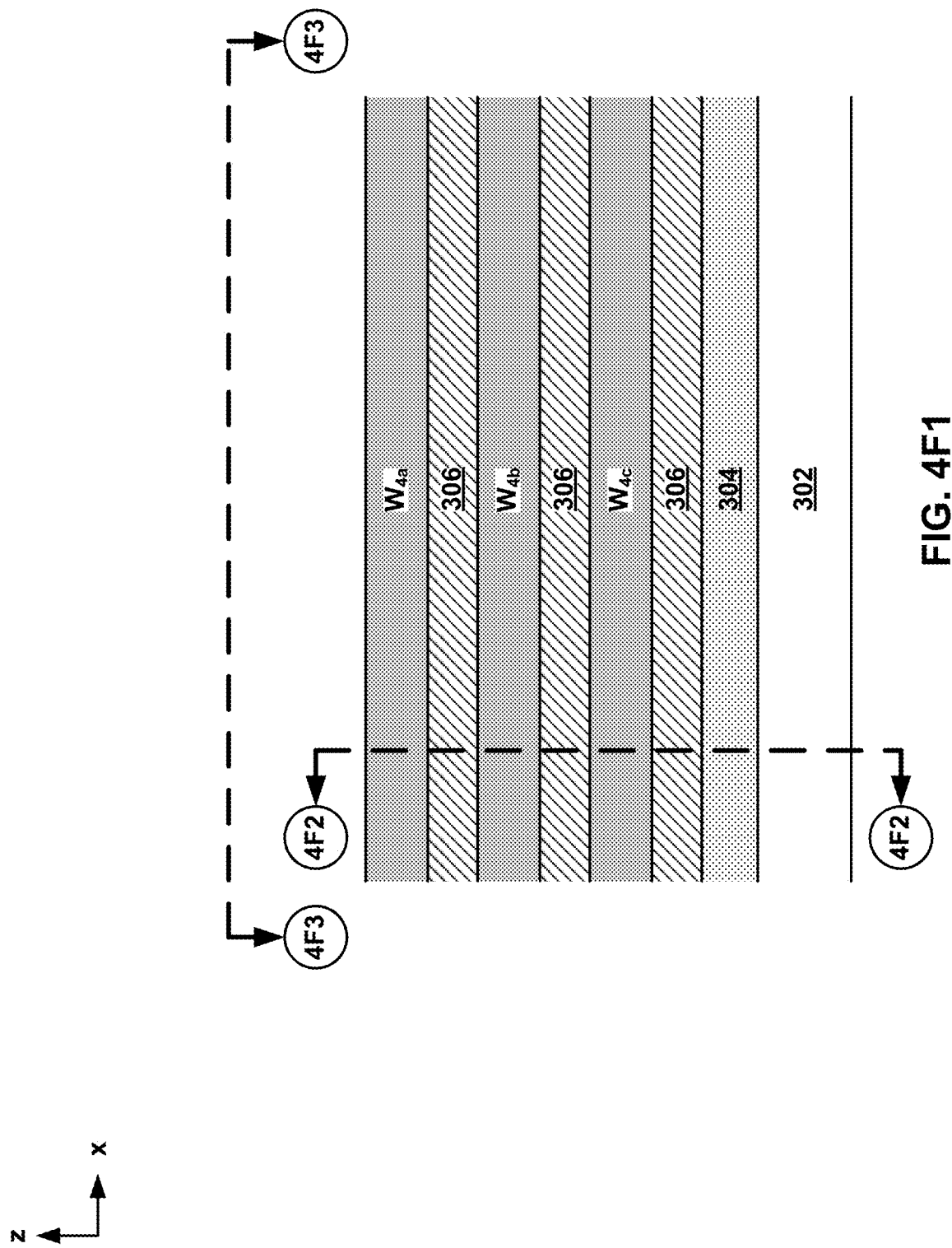

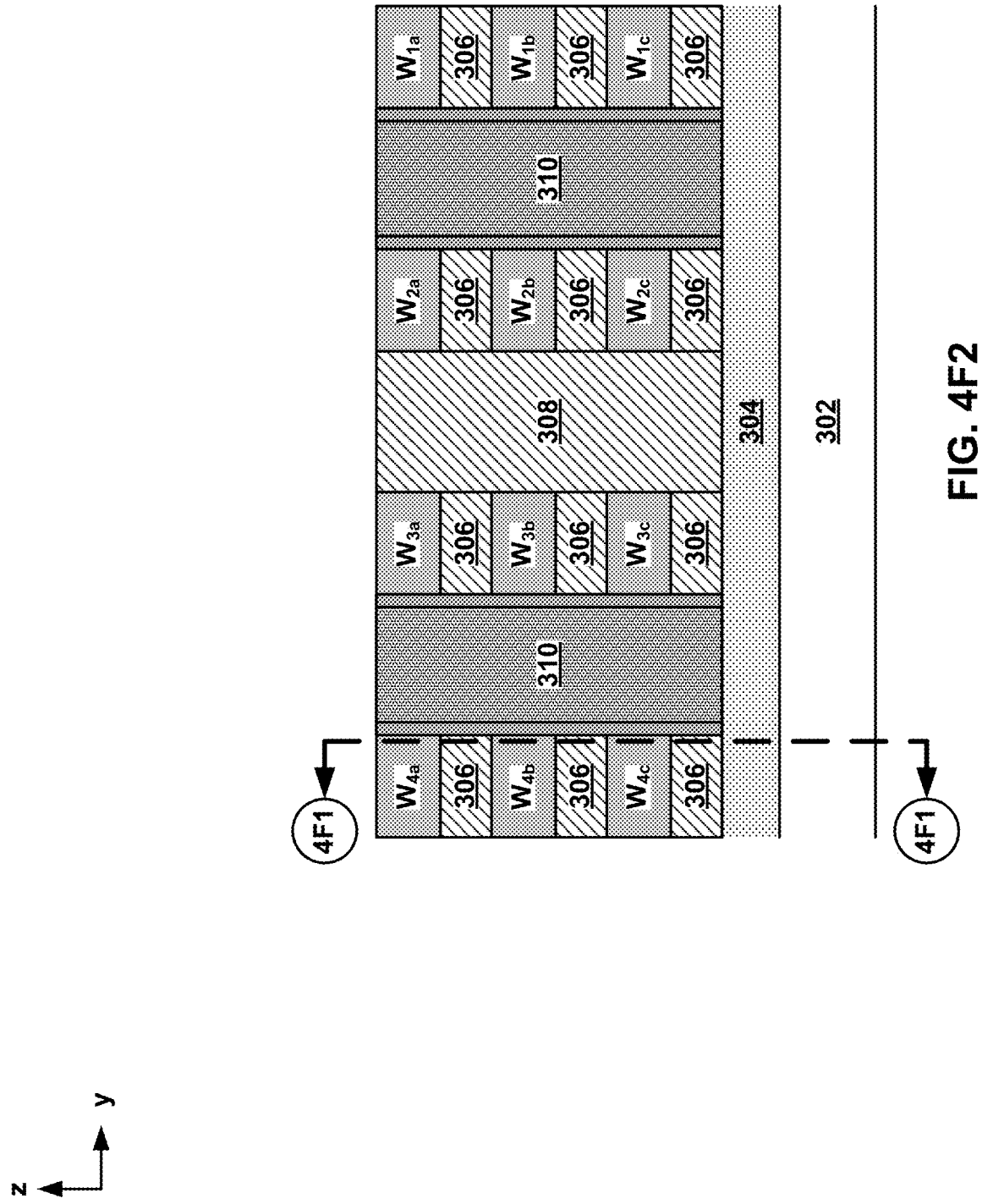
FIG. 4F2

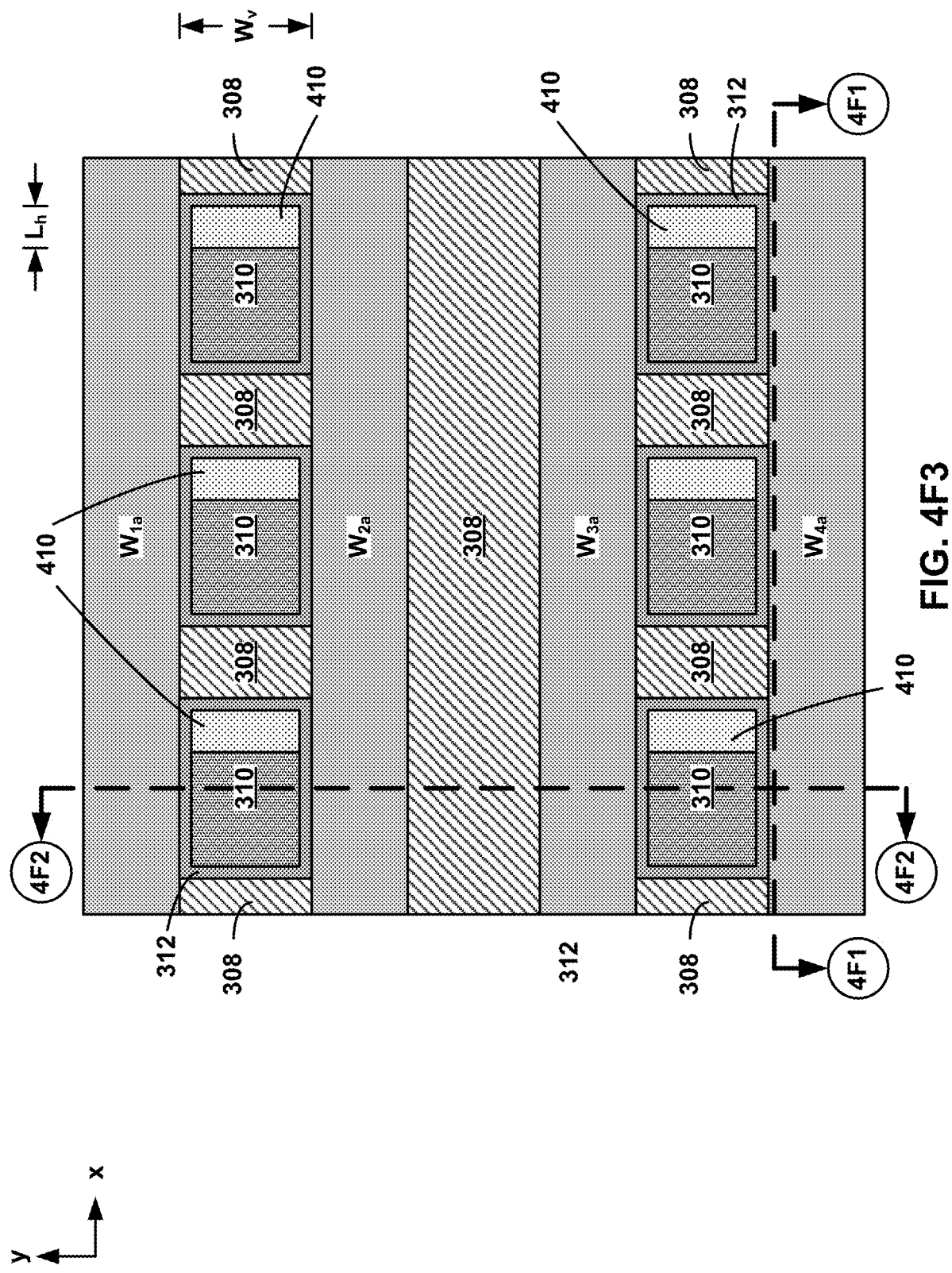
FIG. 4F3

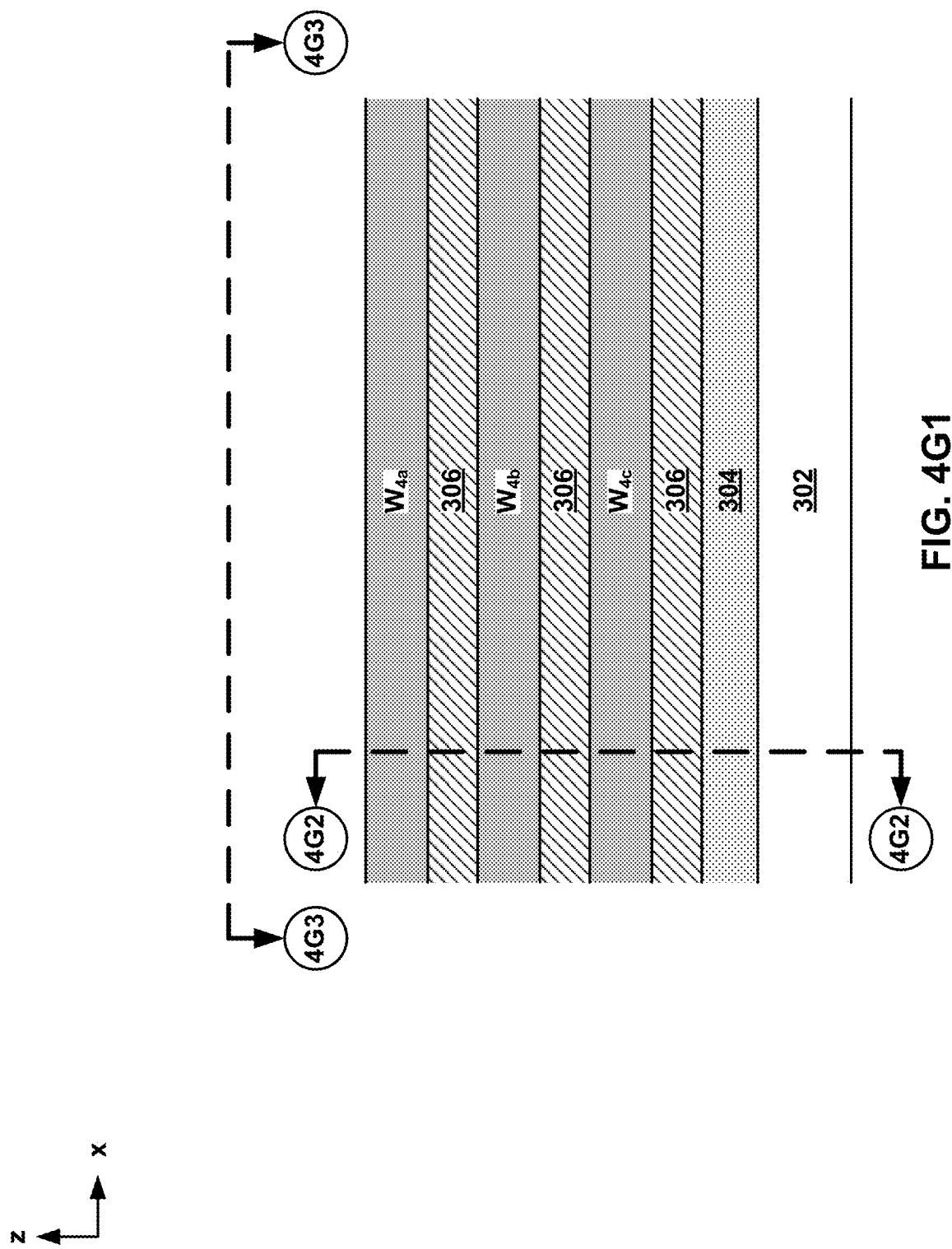
FIG. 4G1

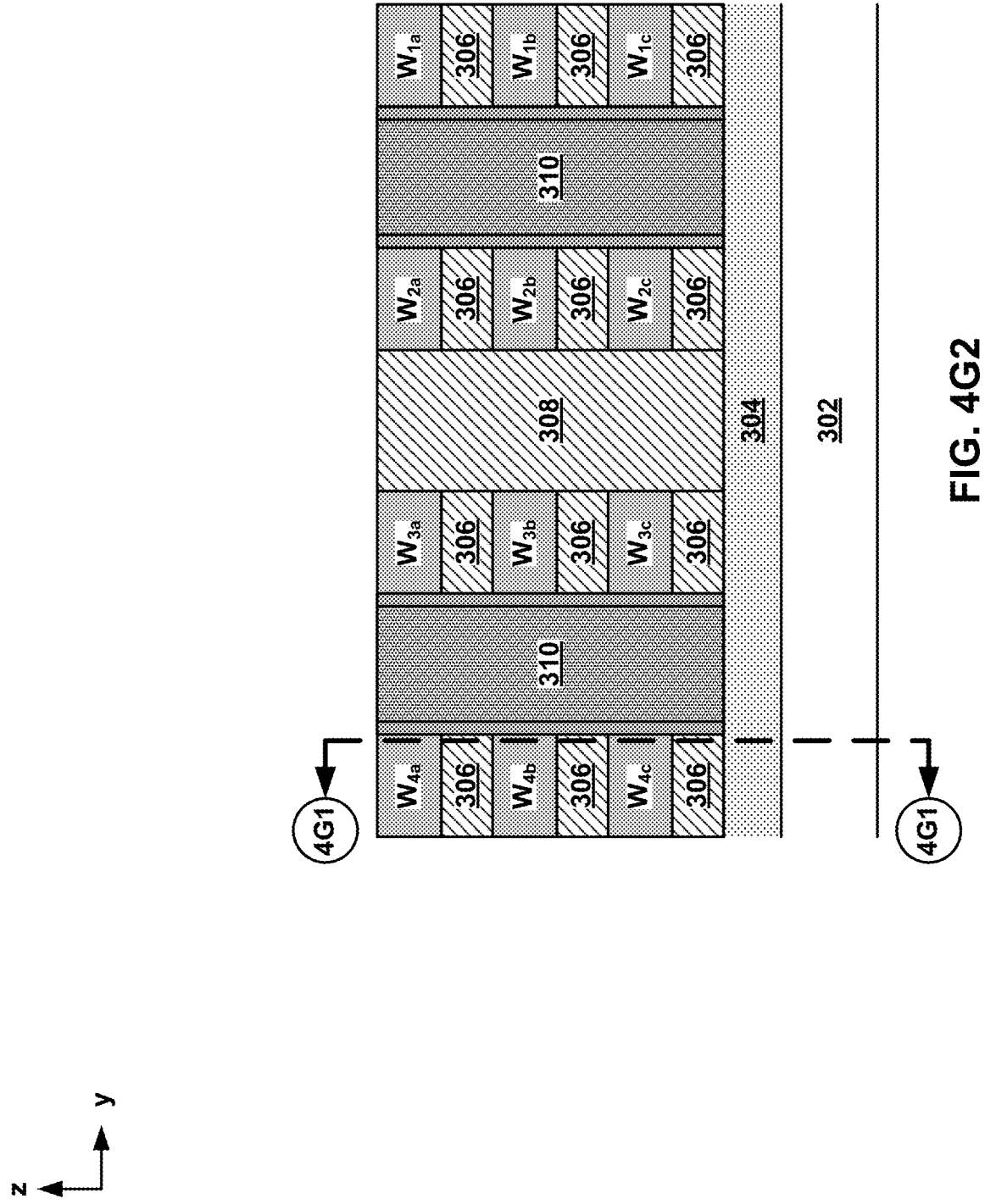
FIG. 4G2

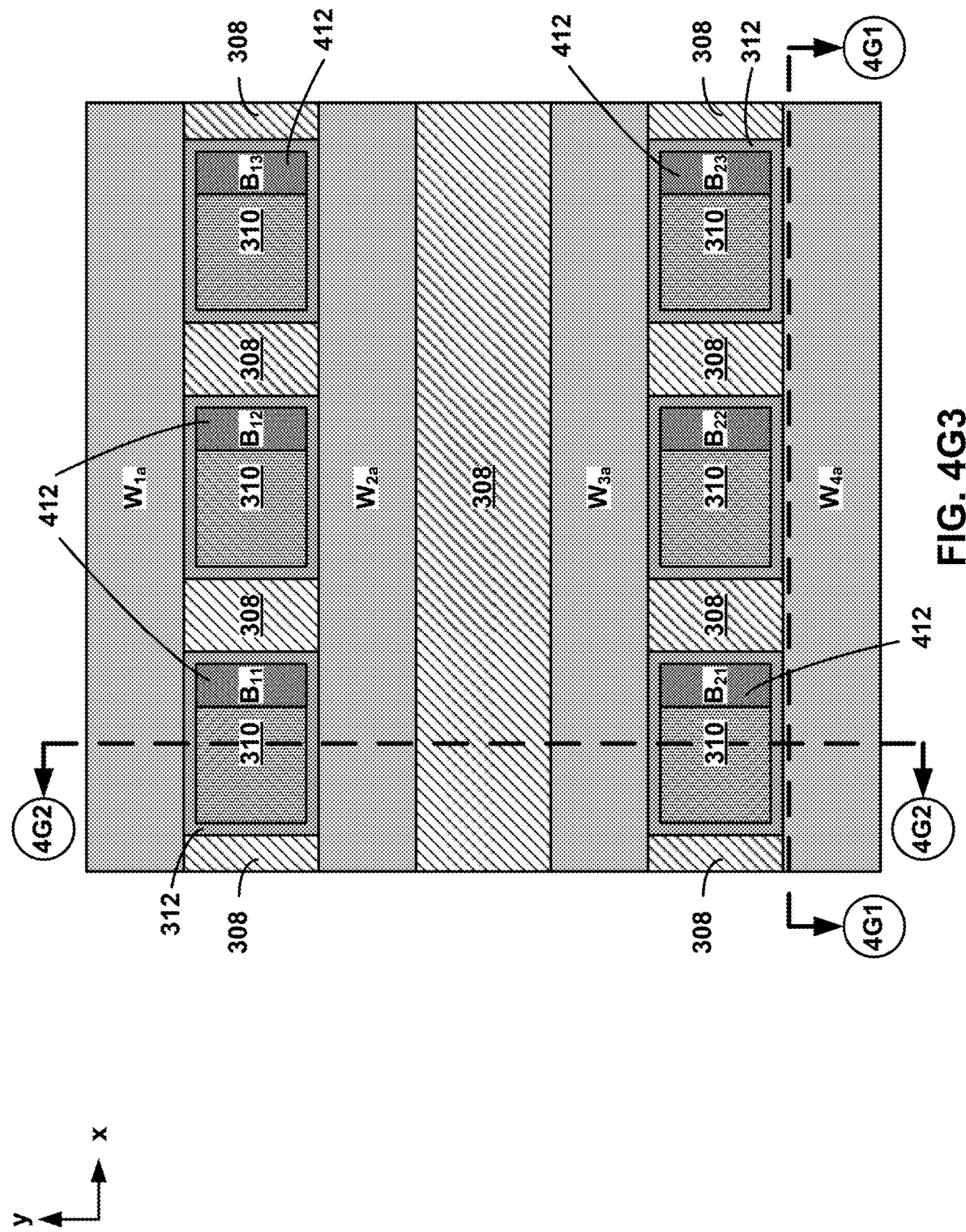
FIG. 4G3

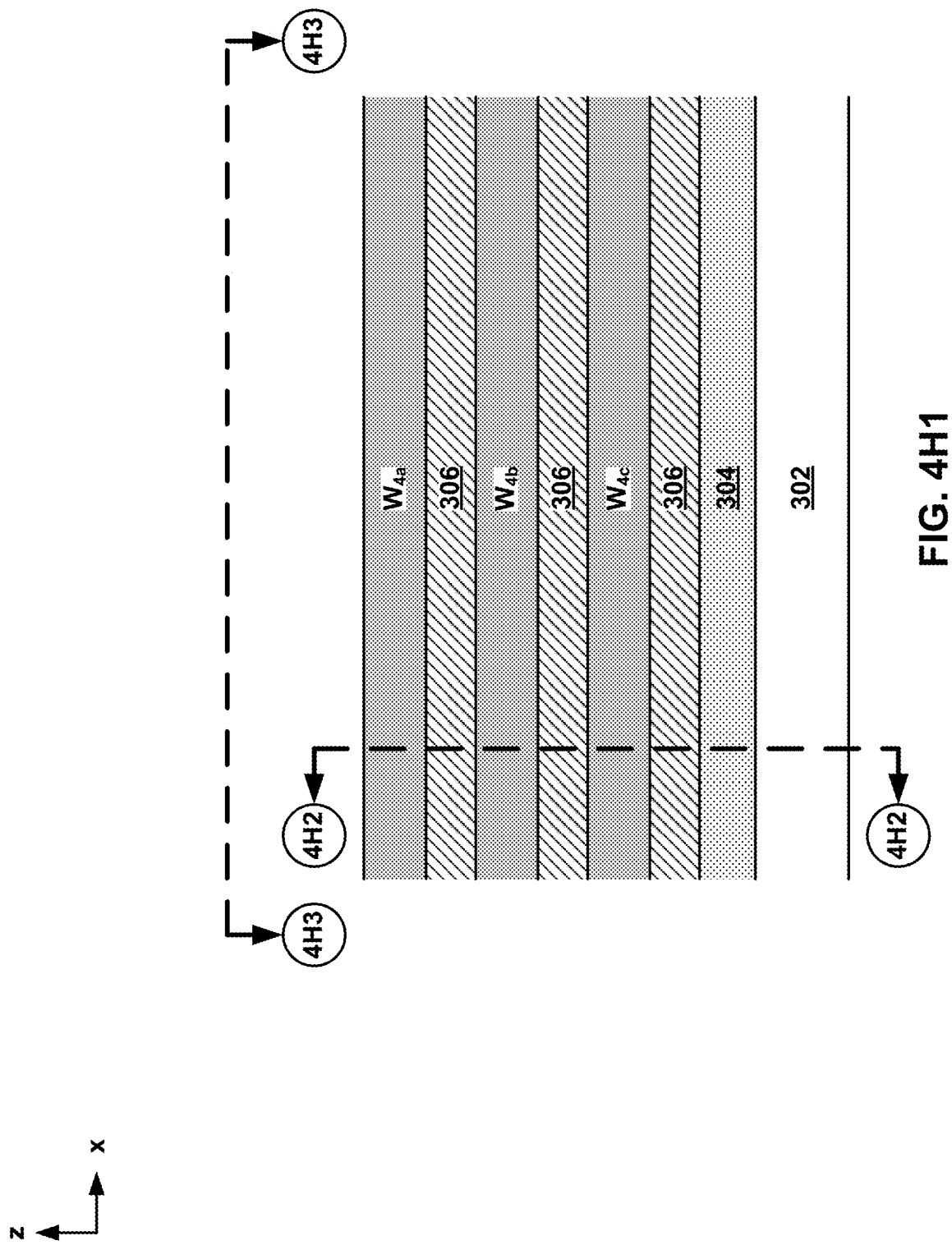

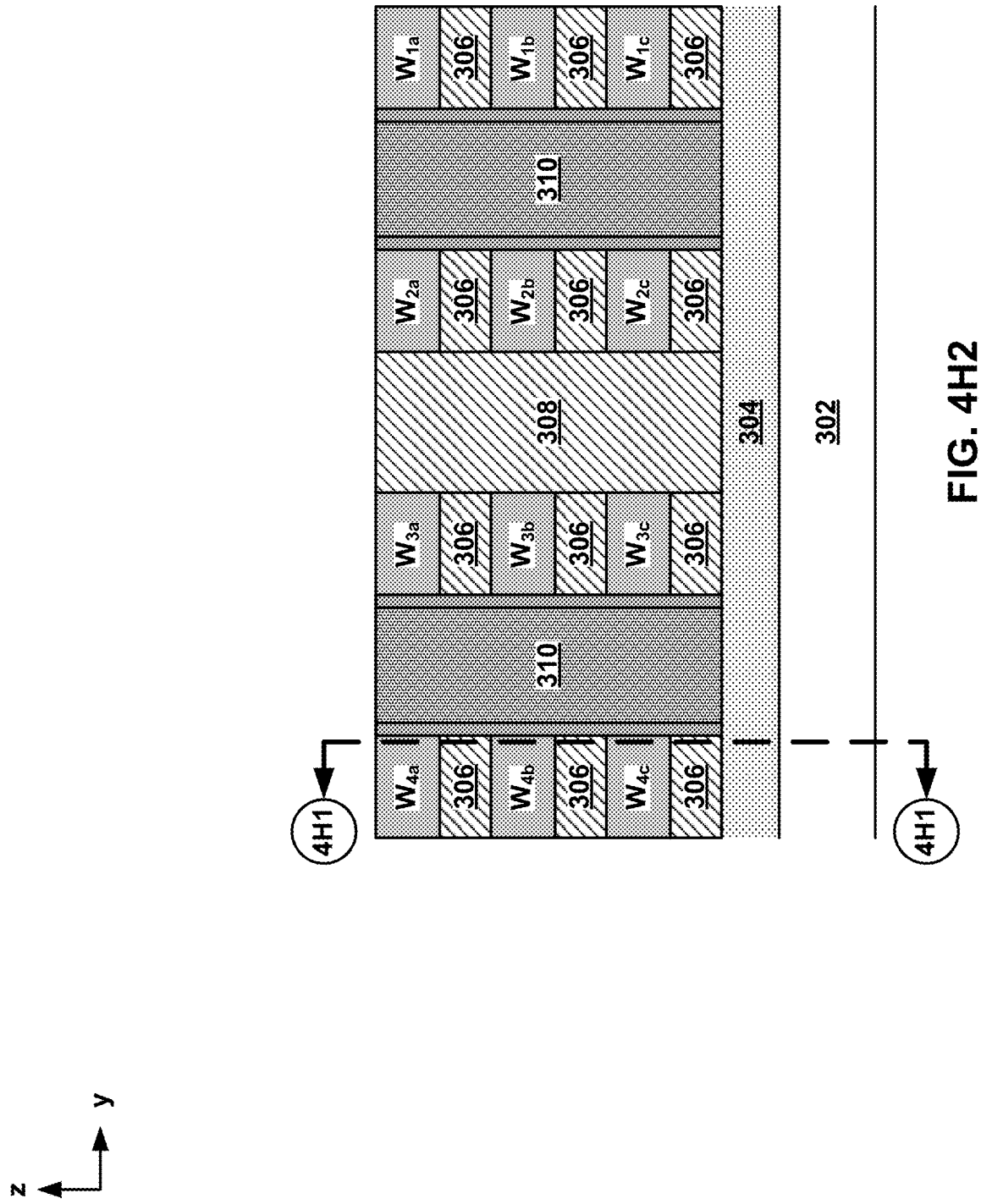
FIG. 4H2

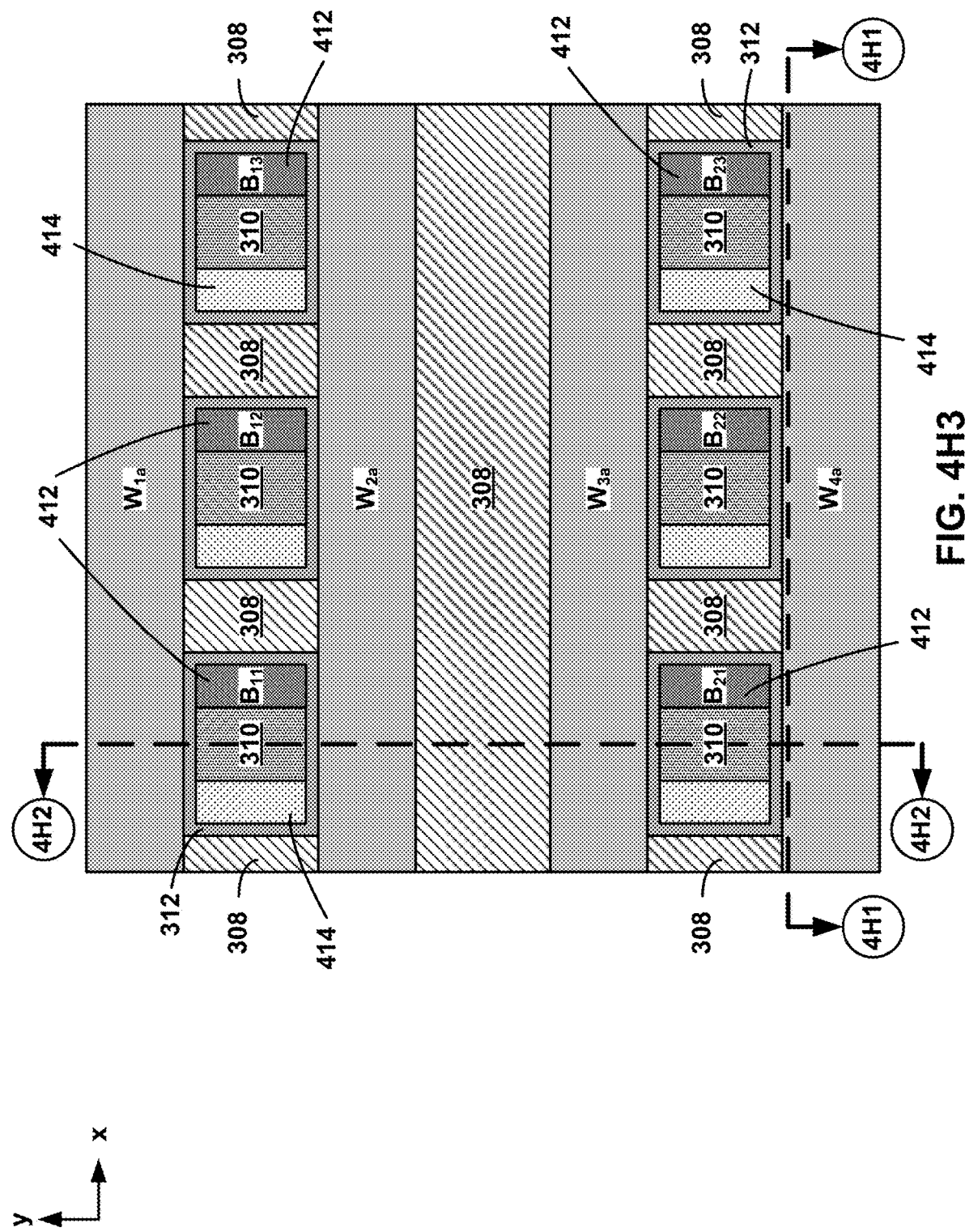
FIG. 4H3

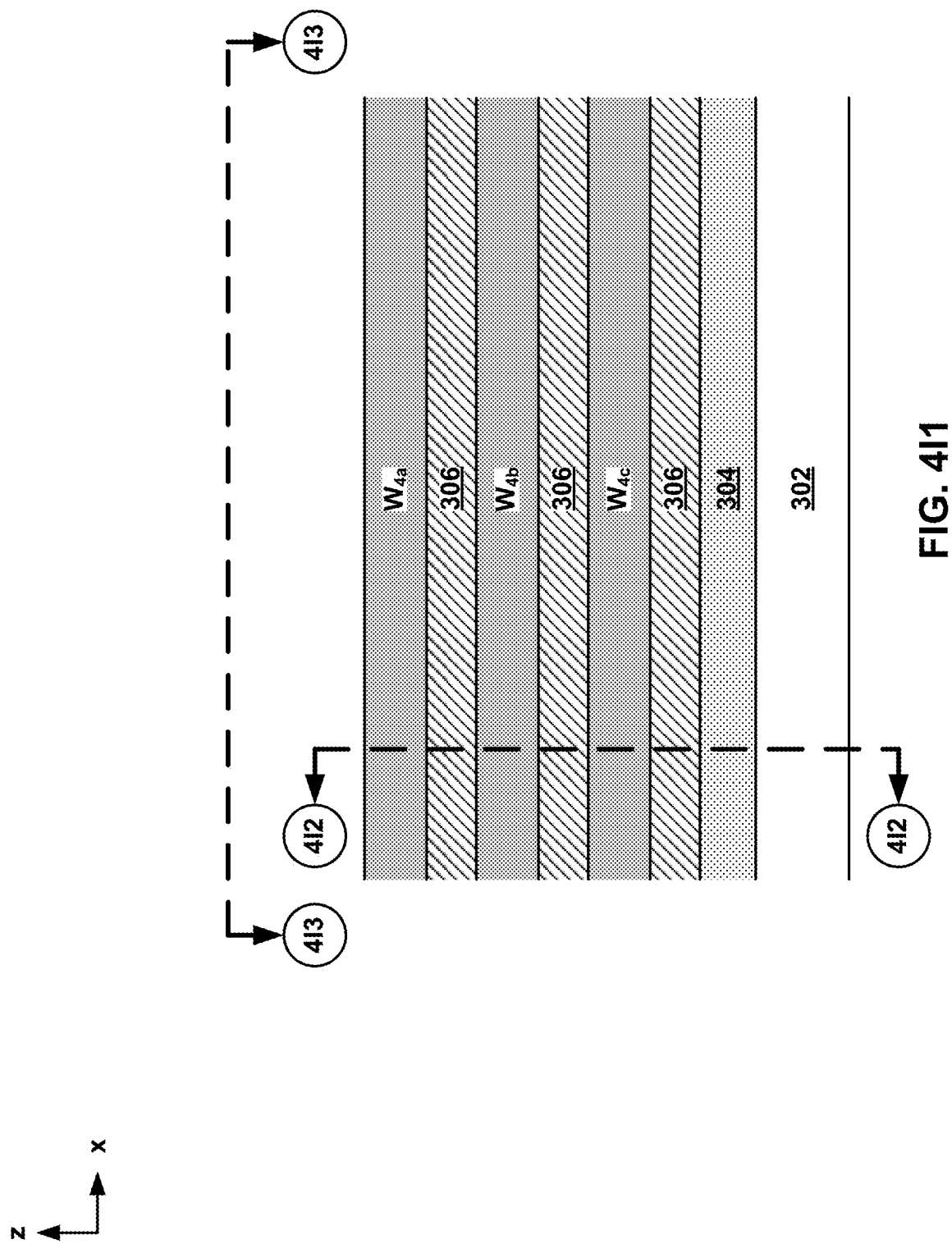

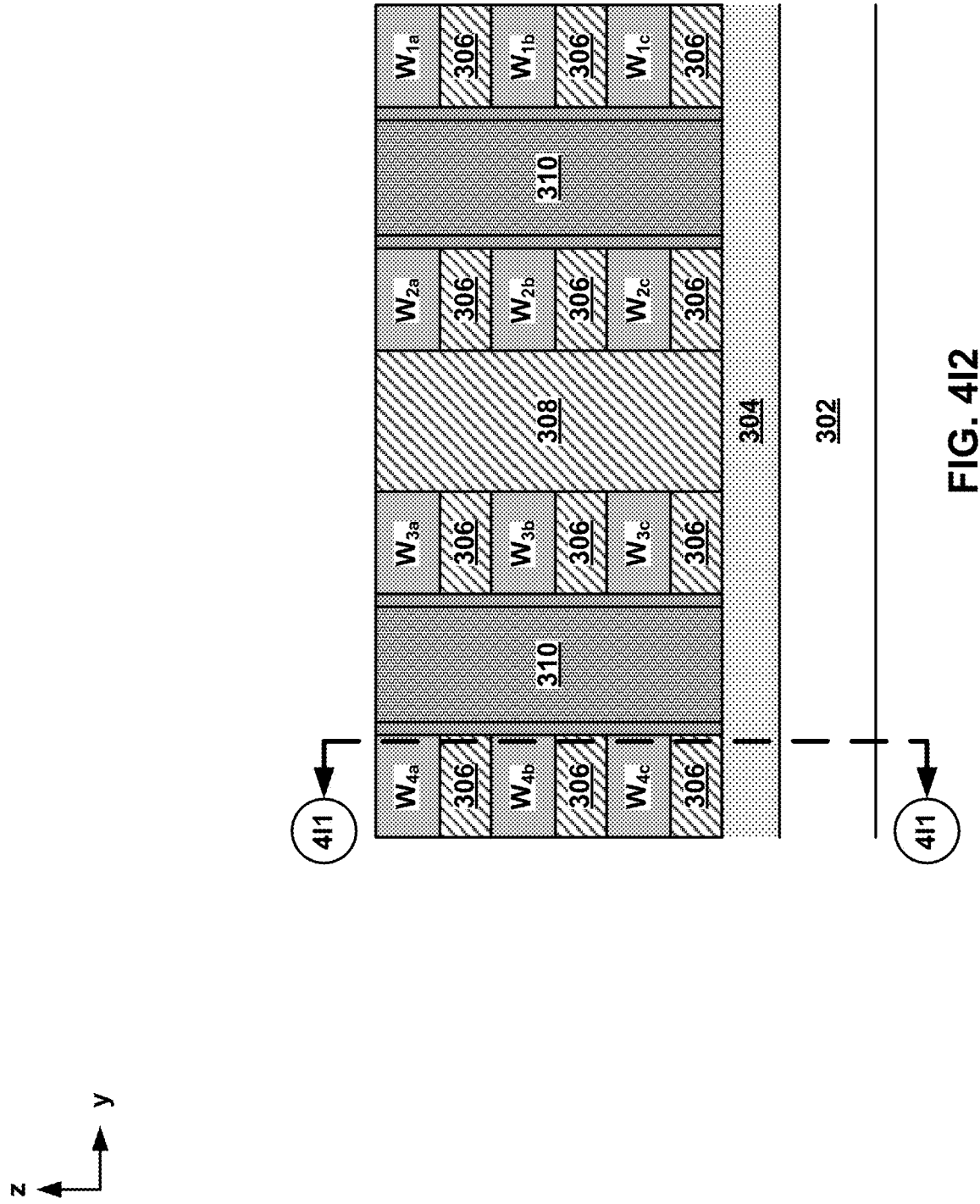

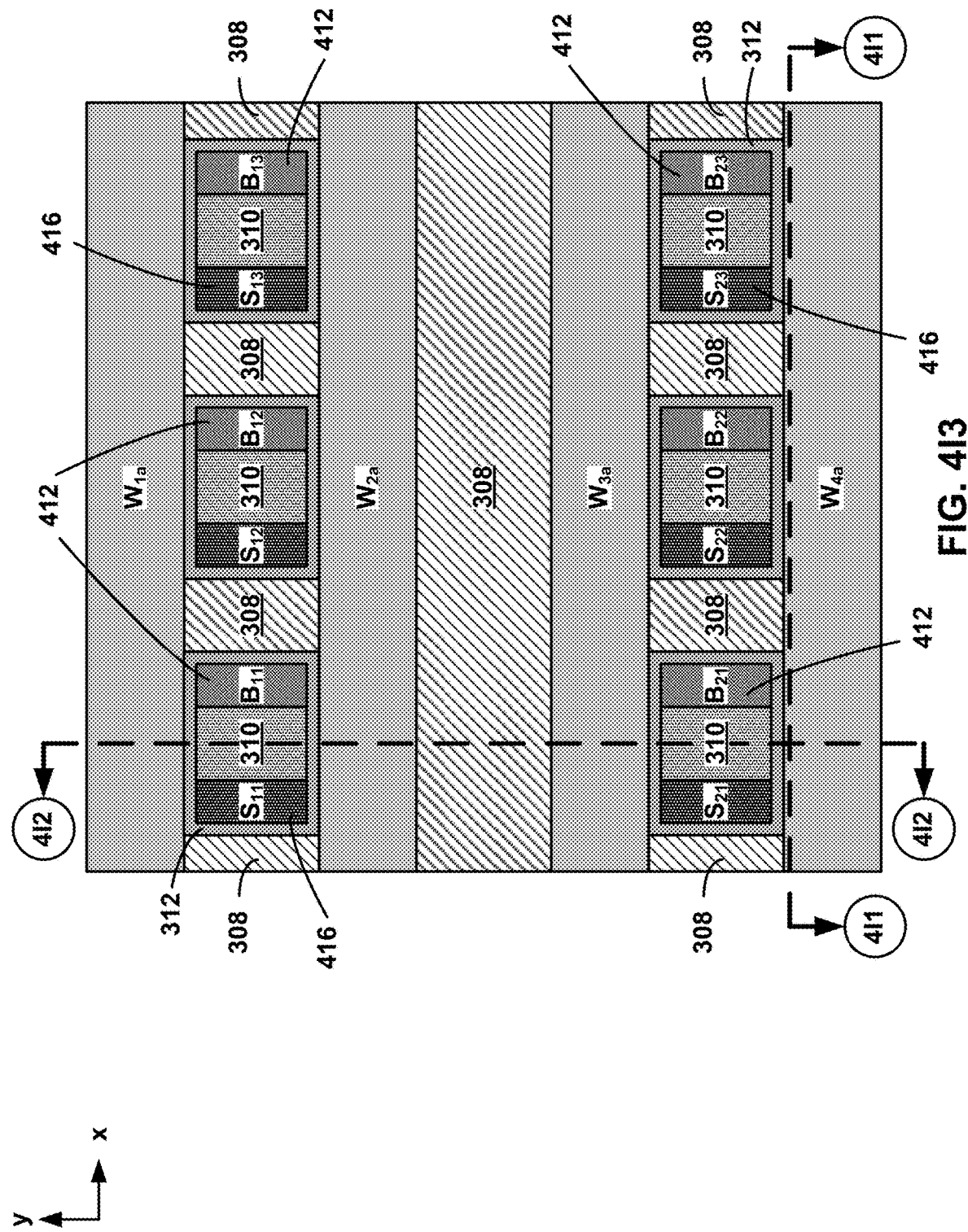
FIG. 4I3

THREE DIMENSIONAL FERROELECTRIC MEMORY

CROSS REFERENCE TO RELATED APPLICATIONS

This application claims the benefit of U.S. Provisional Patent Application 62/726,518, "THREE DIMENSIONAL FERROELECTRIC MEMORY," filed on Sep. 4, 2018, which is incorporated herein by reference in its entirety for all purposes.

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may include non-volatile memory or volatile memory. A non-volatile memory device allows information to be stored or retained even when the non-volatile memory device is not connected to a source of power (e.g., a battery).

Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM). In recent years, non-volatile memory devices have been scaled to reduce the cost per bit. However, as process geometries shrink, many design and process challenges are presented.

BRIEF DESCRIPTION OF THE DRAWINGS

FIGS. 2B 1-2B3 depict separate levels of the embodiment of a portion of a monolithic three-dimensional memory array of FIG. 2A.

FIGS. 4A1-4I3 are cross-sectional views of a portion of a substrate during an example fabrication of the memory array of FIGS. 3A-3D.

DETAILED DESCRIPTION

Single-transistor (1T) memory elements, memory arrays of 1T memory elements, and monolithic three-dimension memory arrays of 1T memory elements are described. In particular, memory elements are described that include a transistor having a gate oxide that includes a ferroelectric material. In an embodiment, the ferroelectric material includes an orthorhombic phase hafnium oxide layer including at least one dopant selected from Al, Zr, and/or Si In an embodiment, a non-volatile storage system may include one or more two-dimensional arrays of non-volatile memory cells. The memory cells within a two-dimensional memory array may form a single layer of memory cells and may be selected via control lines (e.g., bit lines, source lines and word lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate.

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

Figure 1A:
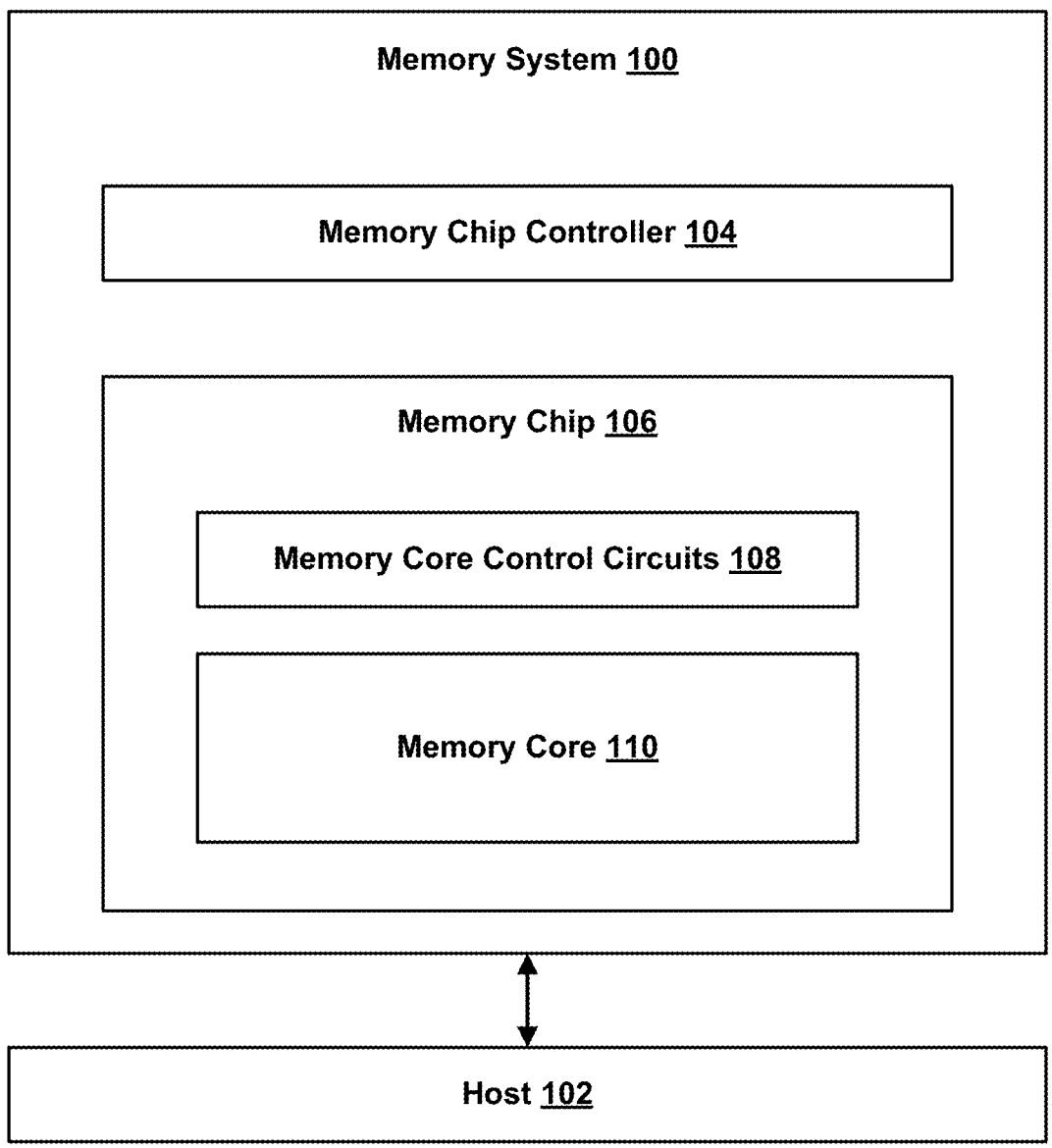
FIG. 1A depicts an embodiment of a memory system and a host.

FIG. 1A depicts one embodiment of a memory system 100 and a host 102. Memory system 100 may include a non-volatile storage system interfacing with host 102 (e.g., a mobile computing device). In some cases, memory system 100 may be embedded within host 102. In other cases, memory system 100 may include a memory card. As depicted, memory system 100 includes a memory chip controller 104 and a memory chip 106. Although a single memory chip 106 is depicted, memory system 100 may include more than one memory chip (e.g., four, eight or some other number of memory chips). Memory chip controller 104 may receive data and commands from host 102 and provide memory chip data to host 102.

Memory chip controller 104 may include one or more state machines, page registers, SRAM, and control circuitry for controlling the operation of memory chip 106. The one or more state machines, page registers, SRAM, and control circuitry for controlling the operation of memory chip 106 may be referred to as managing or control circuits. The managing or control circuits may facilitate one or more memory array operations, such as forming, erasing, programming, or reading operations.

In some embodiments, the managing or control circuits (or a portion of the managing or control circuits) for facilitating one or more memory array operations may be integrated within memory chip 106. Memory chip controller 104 and memory chip 106 may be arranged on a single integrated circuit. In other embodiments, memory chip controller 104 and memory chip 106 may be arranged on different integrated circuits. In some cases, memory chip controller 104 and memory chip 106 may be integrated on a system board, logic board, or a PCB.

Memory chip 106 includes memory core control circuits 108 and a memory core 110. Memory core control circuits 108 may include logic for controlling the selection of memory blocks (or arrays) within memory core 110, controlling the generation of voltage references for biasing a particular memory array into a read or write state, or generating row and column addresses.

Memory core 110 may include one or more two-dimensional arrays of memory cells or one or more three-dimensional arrays of memory cells. In one embodiment, memory core control circuits 108 and memory core 110 are arranged on a single integrated circuit. In other embodiments, memory core control circuits 108 (or a portion of memory core control circuits 108) and memory core 110 may be arranged on different integrated circuits.

A memory operation may be initiated when host 102 sends instructions to memory chip controller 104 indicating that host 102 would like to read data from memory system 100 or write data to memory system 100. In the event of a write (or programming) operation, host 102 will send to memory chip controller 104 both a write command and the data to be written. The data to be written may be buffered by memory chip controller 104 and error correcting code (ECC) data may be generated corresponding with the data to be written. The ECC data, which allows data errors that occur during transmission or storage to be detected and/or corrected, may be written to memory core 110 or stored in non-volatile memory within memory chip controller 104. In one embodiment, the ECC data are generated and data errors are corrected by circuitry within memory chip controller 104.

Memory chip controller 104 controls operation of memory chip 106. In one example, before issuing a write operation to memory chip 106, memory chip controller 104 may check a status register to make sure that memory chip 106 is able to accept the data to be written. In another example, before issuing a read operation to memory chip 106, memory chip controller 104 may pre-read overhead information associated with the data to be read. The overhead information may include ECC data associated with the data to be read or a redirection pointer to a new memory location within memory chip 106 in which to read the data requested. Once a read or write operation is initiated by memory chip controller 104, memory core control circuits 108 may generate the appropriate bias voltages for bit lines, source lines and word lines within memory core 110, and generate the appropriate memory block, row, and column addresses.

In some embodiments, one or more managing or control circuits may be used for controlling the operation of a memory array. The one or more managing or control circuits may provide control signals to a memory array to perform a read operation and/or a write operation on the memory array. In one example, the one or more managing or control circuits may include any one of or a combination of control circuitry, state machine, decoders, sense amplifiers, read/write circuits, and/or controllers. The one or more managing circuits may perform or facilitate one or more memory array operations including erasing, programming, or reading operations. In one example, one or more managing circuits may include an on-chip memory controller for determining row and column address, bit line, source line and word line addresses, memory array enable signals, and data latching signals.

Figure 1B:
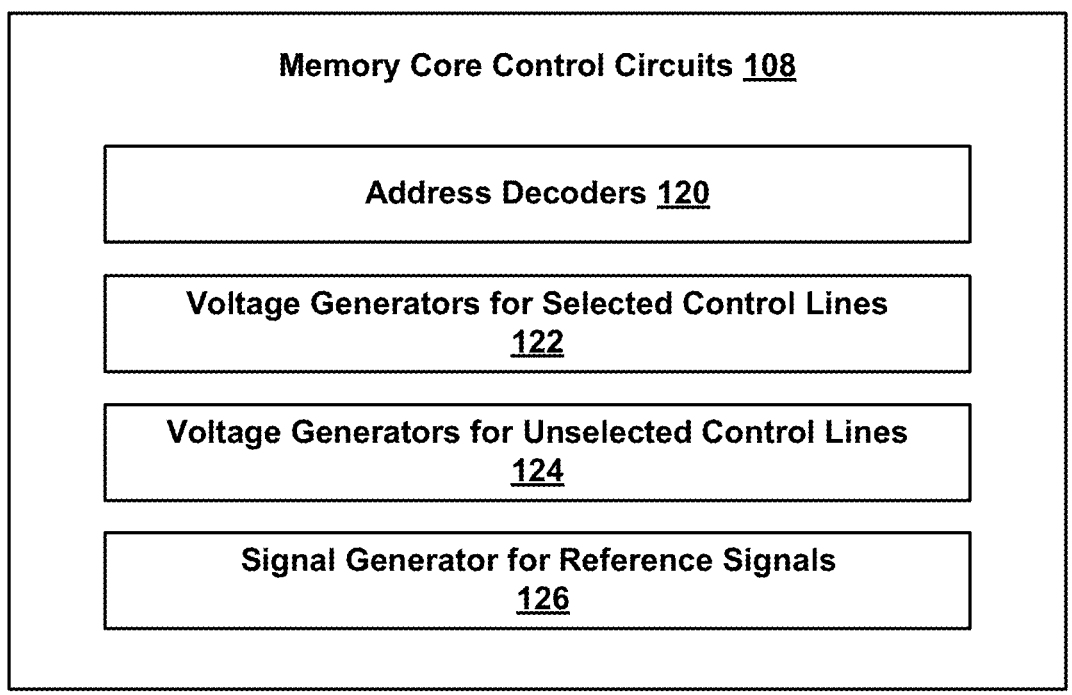
FIG. 1B depicts an embodiment of memory core control circuits.

FIG. 1B depicts an embodiment of memory core control circuits 108. As depicted, memory core control circuits 108 include address decoders 120, voltage generators for selected control lines 122, voltage generators for unselected control lines 124 and signal generators for reference signals 126 (described in more detail below). Control lines may include bit lines, source lines and word lines, or a combination of bit lines, source lines and word lines. Selected control lines may include selected bit lines, selected source lines and/or selected word lines that are used to place memory cells into a selected state. Unselected control lines may include unselected bit lines, unselected source lines and/or unselected word lines that are used to place memory cells into an unselected state.

Address decoders 120 may generate memory block addresses, as well as row addresses and column addresses for a particular memory block. Voltage generators (or voltage regulators) for selected control lines 122 may include one or more voltage generators for generating selected control line voltages. Voltage generators for unselected control lines 124 may include one or more voltage generators for generating unselected control line voltages. Signal generators for reference signals 126 may include one or more voltage and/or current generators for generating reference voltage and/or current signals.

FIGS. 1C-1F depict an embodiment of a memory core organization that includes a memory core having multiple memory bays, and each memory bay having multiple memory blocks. Although a memory core organization is disclosed where memory bays include memory blocks, and memory blocks include a group of memory cells, other organizations or groupings also can be used with the technology described herein.

Figure 1C:
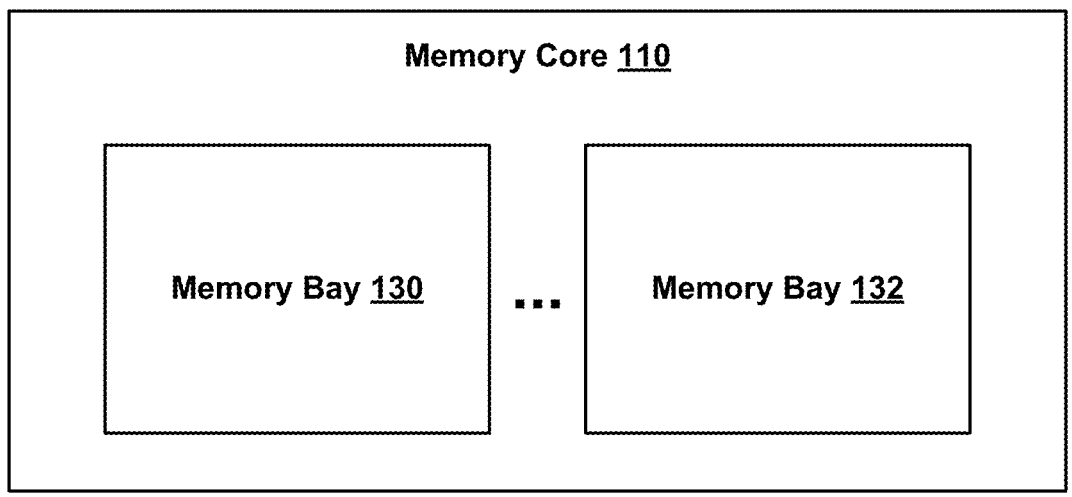
FIG. 1C depicts an embodiment of a memory core.

FIG. 1C depicts one embodiment of memory core 110 in FIG. 1A. As depicted, memory core 110 includes memory bay 130 and memory bay 132. In some embodiments, the number of memory bays per memory core can be different for different implementations. For example, a memory core may include only a single memory bay or multiple memory bays (e.g., 16 or other number of memory bays).

Figure 1D:
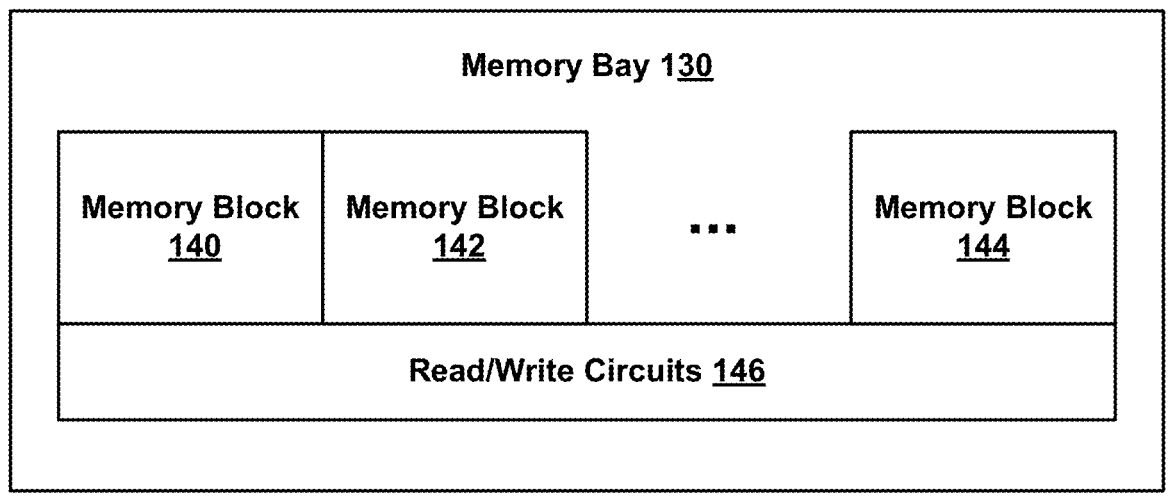
FIG. 1D depicts an embodiment of a memory bay.

FIG. 1D depicts one embodiment of memory bay 130 in FIG. 1C. As depicted, memory bay 130 includes memory blocks 140-144 and read/write circuits 146. In some embodiments, the number of memory blocks per memory bay may be different for different implementations. For example, a memory bay may include one or more memory blocks (e.g., 32 or other number of memory blocks per memory bay). Read/write circuits 146 include circuitry for reading and writing memory cells within memory blocks 140-144.

As depicted, read/write circuits 146 may be shared across multiple memory blocks within a memory bay. This allows chip area to be reduced because a single group of read/write circuits 146 may be used to support multiple memory blocks. However, in some embodiments, only a single memory block may be electrically coupled to read/write circuits 146 at a particular time to avoid signal conflicts.

In some embodiments, read/write circuits 146 may be used to write one or more pages of data into memory blocks 140-144 (or into a subset of the memory blocks). The memory cells within memory blocks 140-144 may permit direct over-writing of pages (i.e., data representing a page or a portion of a page may be written into memory blocks 140-144 without requiring an erase or reset operation to be performed on the memory cells prior to writing the data).

In one example, memory system 100 in FIG. 1A may receive a write command including a target address and a set of data to be written to the target address. Memory system 100 may perform a read-before-write (RBW) operation to read the data currently stored at the target address and/or to acquire overhead information (e.g., ECC information) before performing a write operation to write the set of data to the target address.

In some cases, read/write circuits 146 may be used to program a particular memory cell to be in one of three or more data states (i.e., the particular memory cell may include a multi-level memory cell). In one example, read/write circuits 146 may apply a first voltage difference (e.g., 2V) across the particular memory cell to program the particular memory cell into a first state of the three or more data states or a second voltage difference (e.g., 1V) across the particular memory cell that is less than the first voltage difference to program the particular memory cell into a second state of the three or more data states.

Applying a smaller voltage difference across the particular memory cell may cause the particular memory cell to be partially programmed or programmed at a slower rate than when applying a larger voltage difference. In another example, read/write circuits 146 may apply a first voltage difference across the particular memory cell for a first time period (e.g., 150 ns) to program the particular memory cell into a first state of the three or more data states or apply the first voltage difference across the particular memory cell for a second time period less than the first time period (e.g., 50 ns). One or more programming pulses followed by a memory cell verification phase may be used to program the particular memory cell to be in the correct state.

Figure 1E:
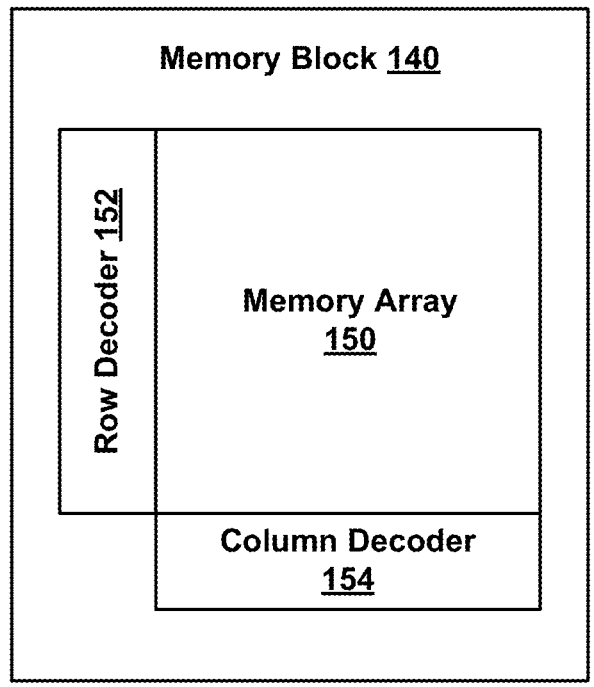
FIG. 1E depicts an embodiment of a memory block.

FIG. 1E depicts one embodiment of memory block 140 in FIG. 1D. As depicted, memory block 140 includes a memory array 150, row decoder 152, and column decoder 154. Memory array 150 may include a contiguous group of memory cells having contiguous word lines and bit lines. Memory array 150 may include one or more layers of memory cells. Memory array 150 may include a two-dimensional memory array or a three-dimensional memory array.

Row decoder 152 decodes a row address and selects a particular word line in memory array 150 when appropriate (e.g., when reading or writing memory cells in memory array 150). Column decoder 154 decodes a column address and selects one or more bit lines in memory array 150 to be electrically coupled to read/write circuits, such as read/write circuits 146 in FIG. 1D. In one embodiment, the number of word lines is 4K per memory layer, the number of bit lines is 1K per memory layer, and the number of memory layers is 4, providing a memory array 150 containing 16K memory cells.

Figure 1F:
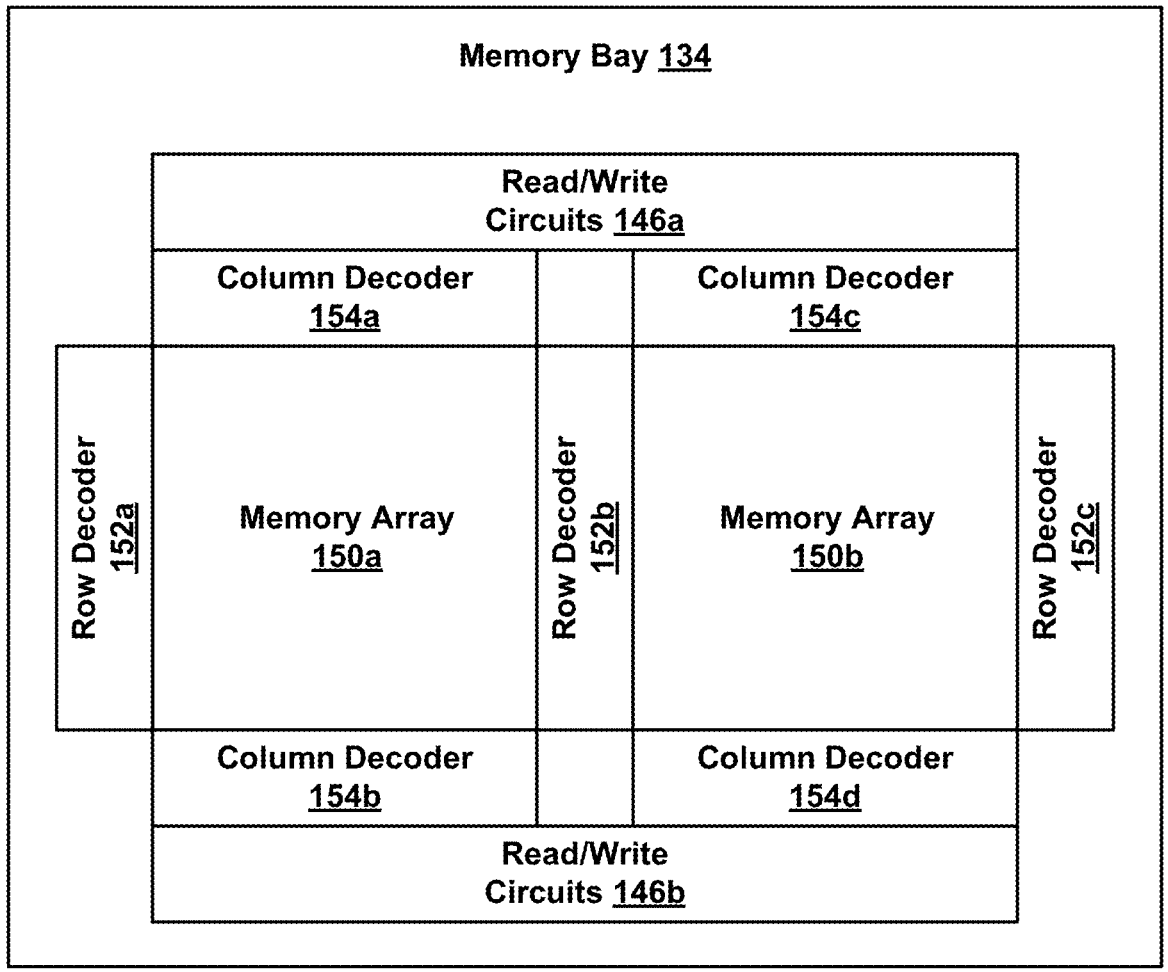
FIG. 1F depicts another embodiment of a memory bay.

FIG. 1F depicts one embodiment of a memory bay 134. Memory bay 134 is one example of an alternative implementation for memory bay 130 in FIG. 1D. In some embodiments, row decoders, column decoders, and read/write circuits may be split or shared between memory arrays. As depicted, row decoder 152b is shared between memory arrays 150a and 150b because row decoder 152b controls word lines in both memory arrays 150a and 150b (i.e., the word lines driven by row decoder 152b are shared).

Row decoders 152a and 152b may be split such that even word lines in memory array 150a are driven by row decoder 152a and odd word lines in memory array 150a are driven by row decoder 152b. Row decoders 152c and 152b may be split such that even word lines in memory array 150b are driven by row decoder 152c and odd word lines in memory array 150b are driven by row decoder 152b.

Column decoders 154a and 154b may be split such that even bit lines in memory array 150a are controlled by column decoder 154b and odd bit lines in memory array 150a are driven by column decoder 154a. Column decoders 154c and 154d may be split such that even bit lines in memory array 150b are controlled by column decoder 154d and odd bit lines in memory array 150b are driven by column decoder 154c.

The selected bit lines controlled by column decoder 154a and column decoder 154c may be electrically coupled to read/write circuits 146a. The selected bit lines controlled by column decoder 154b and column decoder 154d may be electrically coupled to read/write circuits 146b. Splitting the read/write circuits into read/write circuits 146a and 146b when the column decoders are split may allow for a more efficient layout of the memory bay.

Figure 2A:
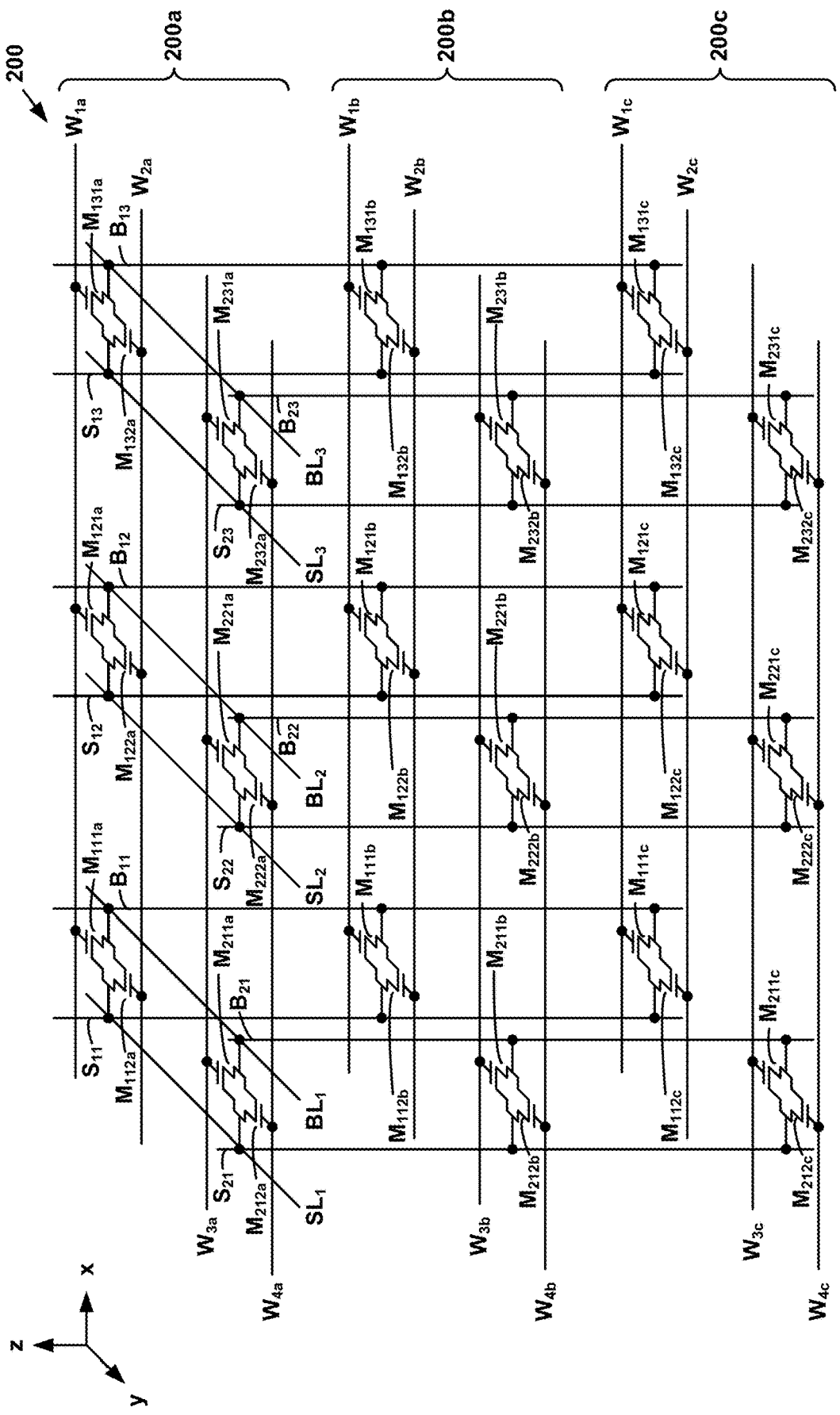
FIG. 2A depicts an embodiment of a portion of a monolithic three-dimensional memory array.
Figure 2B:
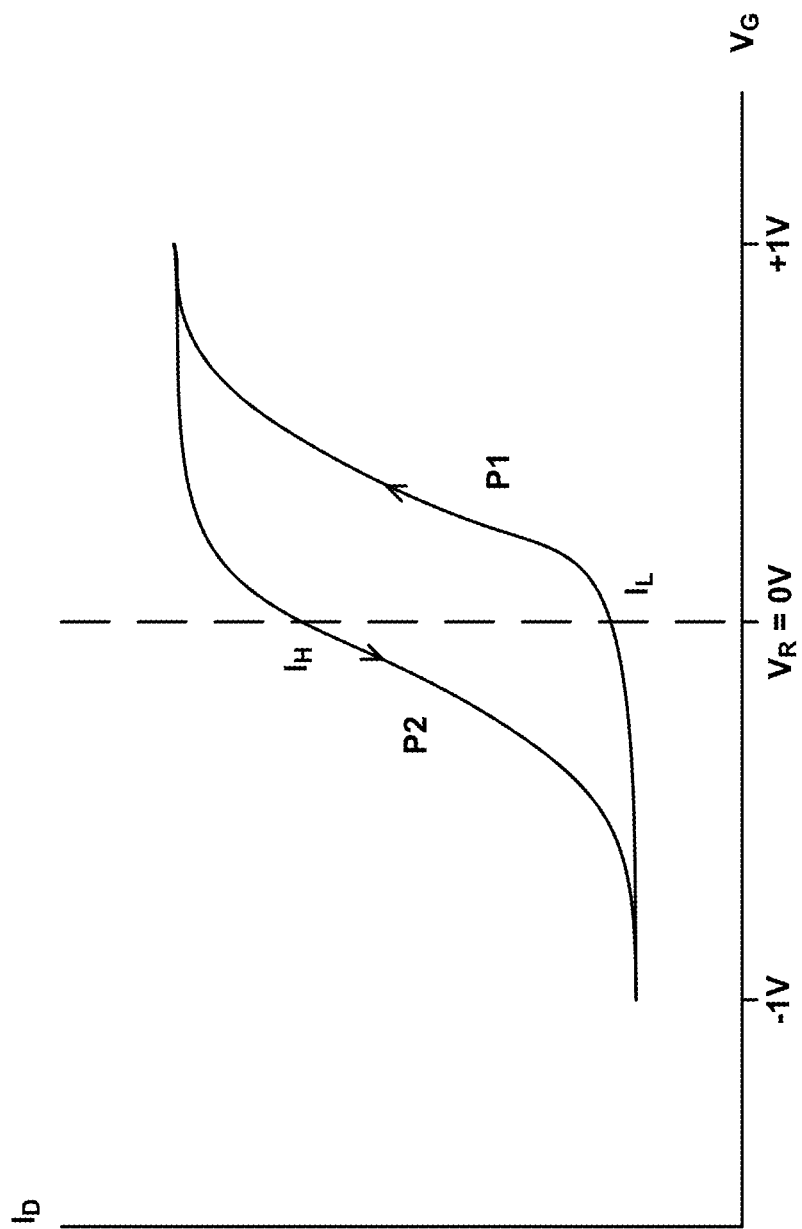

FIG. 2A depicts one embodiment of a portion of a monolithic three-dimensional memory array 200 that includes a first memory level 200a, a second memory level 200b positioned below first memory level 200a, and a third memory level 200c positioned below second memory level 200b. FIGS. 2B1-2B3 depict first memory level 200a, second memory level 200b, and third memory level 200c, respectively, of memory array 200 of FIG. 2A. Persons of ordinary skill in the art will understand that monolithic three-dimensional memory array 200 may include more or fewer than three layers. Memory array 200 is one example of an implementation for memory array 150 in FIG. 1E.

Memory array 200 includes bit lines $BL_1$-$BL_3$ and source lines $SL_1$-$SL_3$ extending in a first direction (e.g., a y-direction), word lines $WL_{1a}$-$WL_{4c}$ extending in a second direction (e.g., an x-direction) perpendicular to the first direction, and vertically-oriented "bit line plugs" $B_{11}$-$B_{23}$ and vertically-oriented "source line plugs" $S_{11}$-$S_{23}$ extending in a third direction perpendicular to the first direction and the second direction (e.g., a z-direction).

In an embodiment, bit line plugs $B_{11}$ and $B_{21}$ are coupled to bit line $BL_1$, bit line plugs $B_{12}$ and $B_{22}$ are coupled to bit line $BL_2$, and bit line plugs $B_{13}$ and $B_{23}$ are coupled to bit line $BL_3$. In an embodiment, source line plugs $S_{11}$ and $S_{21}$ are coupled to source line $SL_1$, source line plugs $S_{12}$ and $S_{22}$ are coupled to source line $SL_2$, and source line plugs $S_{13}$ and $S_{23}$ are coupled to source line $SL_3$.

Memory array 200 also includes memory elements $M_{111a}$-$M_{232c}$, each including a portion of a corresponding one of bit line plugs $B_{11}$-$B_{23}$ and a portion of a corresponding one of source line plugs $S_{11}$-$S_{23}$, and each coupled to a corresponding one of word lines $WL_{1a}$-$WL_{4c}$. For example, memory element $M_{111a}$ includes a portion of bit line plug $B_{11}$ and a portion of source line plug $S_{11}$, and is coupled to word line $WL_{1a}$. Likewise, memory element $M_{221b}$ includes a portion of bit line plug $B_{22}$ and a portion of source line plug $S_{22}$, and is coupled to word line $WL_{3b}$. As described in more detail below, each of memory elements $M_{111a}$-$M_{232c}$ also includes a channel region disposed between a portion of a corresponding one of bit line plugs $B_{11}$-$B_{23}$ and a portion of a corresponding one of source line plugs $S_{11}$-$S_{23}$.

In an embodiment, each of memory elements $M_{111a}$-$M_{232c}$ is a ferroelectric memory element that includes a ferroelectric material, and in particular each of memory elements $M_{111a}$-$M_{232c}$ includes a ferroelectric field-effect transistor (Fe-FET). Accordingly, each of memory elements $M_{111a}$-$M_{232c}$ also will be referred to herein as FeFETs $M_{111a}$-$M_{232c}$. In an embodiment, each of memory elements $M_{111a}$-$M_{232c}$ includes a Fe-FET and includes no other circuit elements.

For example, memory element $M_{121a}$ has a first electrode (e.g., a drain/source electrode) coupled to bit line plug $B_{12}$, a second electrode (e.g., a source/drain electrode) coupled to source line plug $S_{12}$, and a gate electrode coupled to word line $WL_{1a}$. Likewise, memory element $M_{212b}$ has a first electrode (e.g., a drain/source electrode) coupled to bit line plug $B_{21}$, a second electrode (e.g., a source/drain electrode) coupled to source line plug $S_{21}$, and a gate electrode coupled to word line $WL_{3b}$. Similarly, memory element $M_{131c}$ has a first electrode (e.g., a drain/source electrode) coupled to bit line plug $B_{13}$, a second electrode (e.g., a source/drain electrode) coupled to source line plug $S_{13}$, and a gate electrode coupled to word line $WL_{1c}$.

Figure 2C:
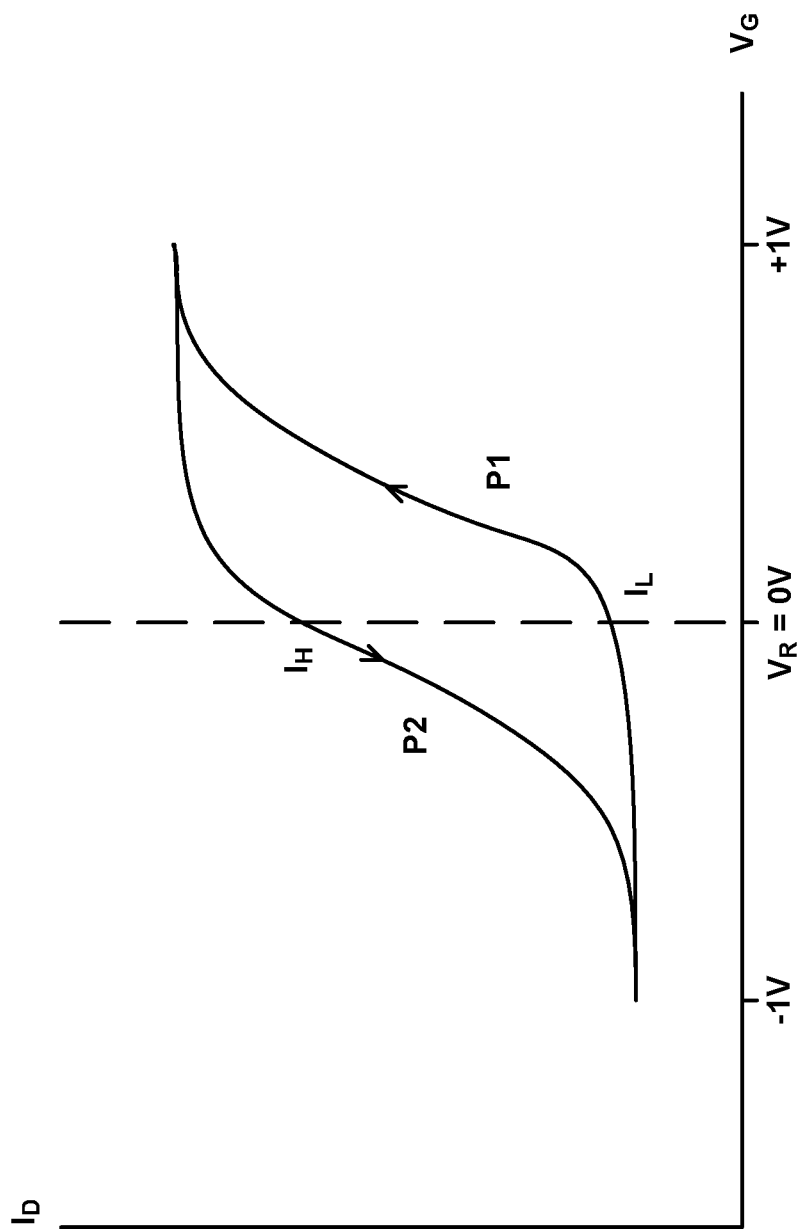
FIG. 2C depicts an example electrical characteristic of a ferroelectric field effect transistor.
Figure 3A:
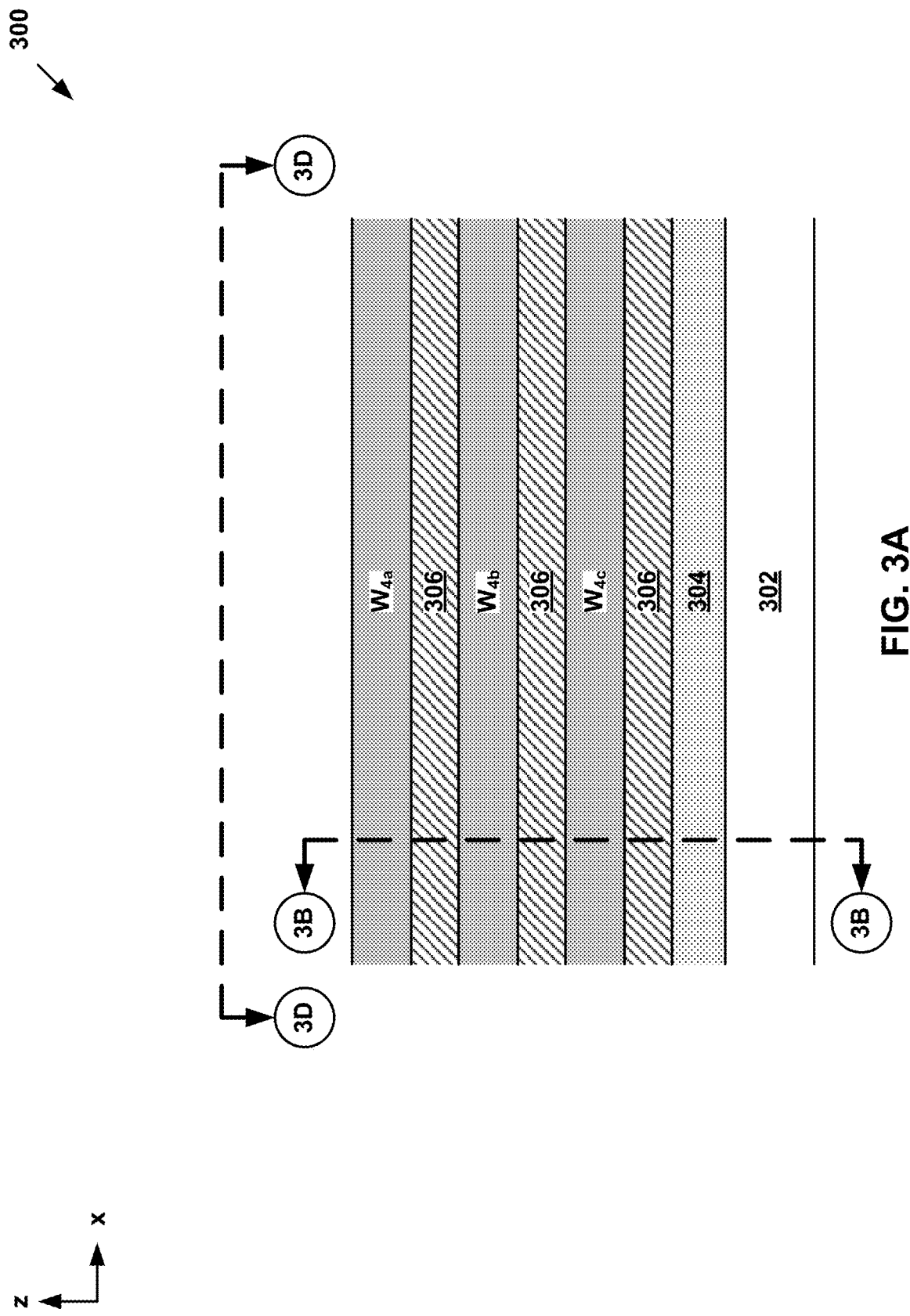
FIGS. 3A-3D depict various views of an embodiment monolithic three-dimensional memory array.
Figure 3B:
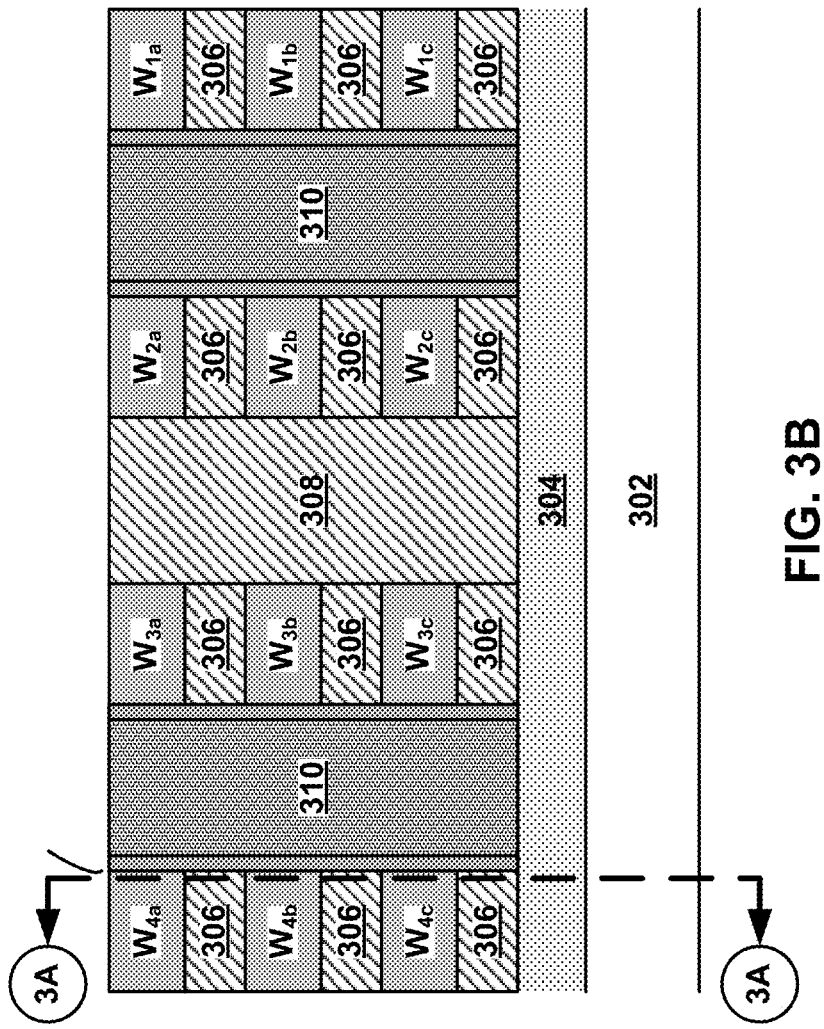
Figure 3C:
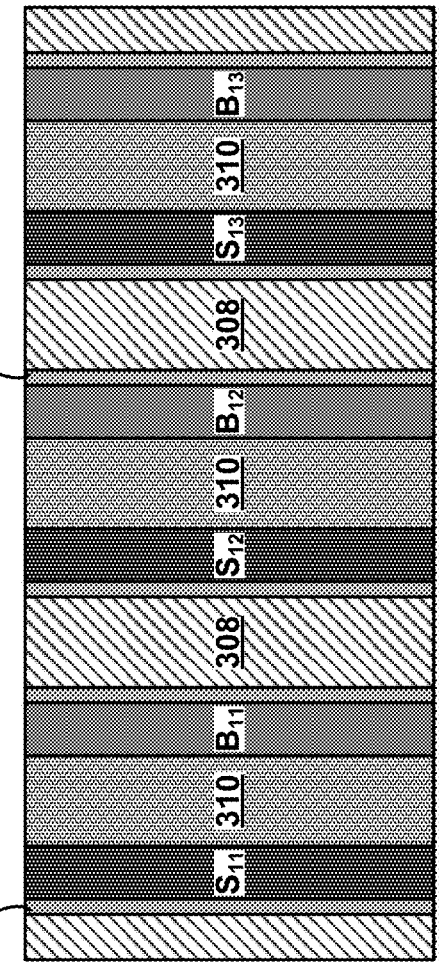
Figure 3D:
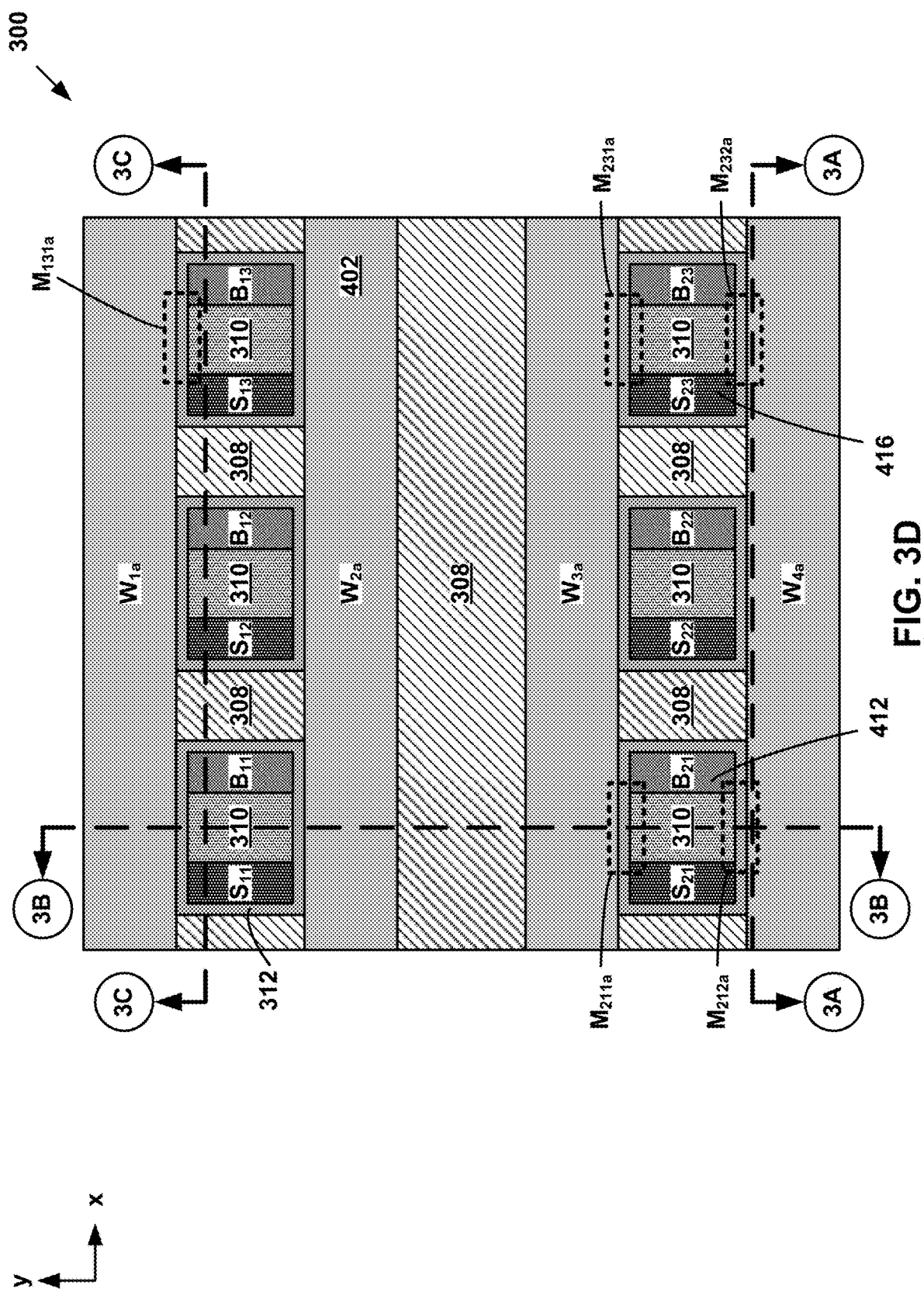

FIG. 2C depicts an illustrative electrical characteristic (drain current $I_D$ versus gate voltage $V_G$) plot of a FeFET memory element. As illustrated in FIG. 2C, by virtue of applying a positive or negative voltage to the gate electrode of a FeFET memory element, the polarization of the FeFET memory element can be flipped from a first polarization state (e.g., P1) to a second polarization state (e.g., P2). After the gate voltage is removed, the FeFET memory element retains the polarization state. To read a selected FeFET memory element, a read voltage $V_R$ (e.g., 0V) is applied to the gate of the selected FeFET memory element, and the drain current of the FeFET memory element is measured. A measured drain current of $I_H$ may correspond to a first memory state, whereas a measured drain current of $I_L$ may correspond to a second memory state.

Referring again to FIG. 2A, in an embodiment, each of memory elements $M_{111a}$-$M_{232c}$ includes a Fe-FET that has a gate oxide that includes a ferroelectric material. As used herein, a "ferroelectric material" is a crystalline material that exhibits spontaneous electrical polarization in the absence of an external electric field. In an embodiment, the ferroelectric material includes an orthorhombic phase hafnium oxide layer including at least one dopant selected from Al, Zr, and/or Si. Other suitable ferroelectric materials may also be used, as such as titanate ferroelectric materials (e.g., barium titanate, lead titanate, lead zirconate titanate, lead lanthanum zirconate titanate ("PLZT"), etc.). In an embodiment, the doped hafnium oxide is in a crystalline or polycrystalline morphology. The crystal grains of the doped orthorhombic phase hafnium oxide are switched, either separately or as an ensemble, between a first polarization state (e.g., P1) to a second polarization state (e.g., P2).

As described above, each of memory elements $M_{111a}$-$M_{232c}$ (e.g., memory element $M_{121a}$) has a first electrode (e.g., a drain/source electrode) coupled to bit line plug (e.g., $B_{12}$), a second electrode (e.g., a source/drain electrode) coupled to source line plug (e.g., $S_{12}$), and a gate electrode coupled to a word line (e.g., $WL_{1a}$). In an embodiment, the gate electrode may be used to selectively induce a conductive channel between the first electrode and the second electrode of the Fe-FET, and set the polarization state (P1/P2) of the FeFET.

FIGS. 3A-3D depict various views of an embodiment of a portion of a monolithic three-dimensional memory array 300 that includes Fe-FETs that have a gate oxide including a ferroelectric material. The physical structure depicted in FIGS. 3A 3D may include one implementation for a portion of the monolithic three-dimensional memory array 200 depicted in FIG. 2A. To avoid overcrowding the drawings, bit lines $BL_1$-$BL_3$ and source lines $SL_1$-$SL_3$ are omitted from monolithic three-dimensional memory array 300.

Monolithic three-dimensional memory array 300 includes bit line plugs $B_{11}$-$B_{23}$ and source line plugs $S_1$-$S_{23}$ extending in a third direction (e.g., a z-direction), and word lines $WL_{1a}$-$WL_{4c}$ extending in a second direction (e.g., an x-direction) perpendicular to the third direction. Persons of ordinary skill in the art will understand that monolithic three-dimensional memory arrays, such as monolithic three-dimensional memory array 300 may include more or fewer than six bit line plugs, six source line plugs, and twelve word lines.

In an embodiment, each of bit line plugs $B_{11}$-$B_{23}$ is formed of a first doped semiconductor material (e.g., n+ polysilicon). In an embodiment, each of source line plugs $S_{11}$-$S_{23}$ is formed of a second doped semiconductor material (e.g., n+ or p+ polysilicon). In an embodiment, each bit line plug $B_{11}$-$B_{23}$ has a rectangular shape, although other shapes may be used. In an embodiment, each source line plug $S_{11}$-$S_{23}$ has a rectangular shape, although other shapes may be used.

In an embodiment (not shown to avoid overcrowding the drawing), bit line plugs $B_{11}$ and $B_{21}$ are coupled to a bit line $BL_1$, bit line plugs $B_{12}$ and $B_{22}$ are coupled to a bit line $BL_2$, and bit line plugs $B_{13}$ and $B_{23}$ are coupled to a bit line $LB_3$. In an embodiment (not shown to avoid overcrowding the drawing), source line plugs $S_{11}$ and $S_{21}$ are coupled to source line $SL_1$, source line plugs $S_{12}$ and $S_{22}$ are coupled to source line $SL_2$, and source line plugs $S_{13}$ and $S_{23}$ are coupled to source line $SL_3$. For example, bit lines $BL_1$-$BL_3$ and source lines $SL_1$-$SL_3$ may extend in first direction (e.g., a y-direction) and may be disposed at a top of monolithic three-dimensional memory array 300.

In an embodiment, bit line plugs $B_{11}$-$B_{23}$, source line plugs $S_{11}$-$S_{23}$, and word lines $WL_{1a}$-$WL_{4c}$ are disposed above a substrate 302, such as a silicon, germanium, silicon-germanium, undoped, doped, bulk, silicon-on-insulator ("SOI") or other substrate with or without additional circuitry. In an embodiment, an isolation layer 304, such as a layer of silicon dioxide, silicon nitride, silicon oxynitride or any other suitable insulating layer, is formed above substrate 302.

In an embodiment, alternating layers of a first dielectric material layer 306 (e.g., $SiO_2$) and word lines $WL_{1a}$-$WL_{4c}$ are disposed above isolation layer 304. Word lines $WL_{1a}$-$WL_{4c}$ are formed of a conductive material (e.g., tungsten, a highly doped semiconductor, or other conductive material) and may include an adhesion layer (not shown) disposed on an outer surface of each word line $WL_{1a}$-$WL_{4c}$. Word lines $WL_{1a}$-$WL_{4c}$ are separated from one another in the y-direction by a second dielectric material layer 308 (e.g., $SiO_2$).

In an embodiment, vertical semiconductor pillars 310 (e.g., p-type polysilicon) are disposed above isolation layer 304. In an embodiment, each vertical semiconductor pillar 310 has a rectangular shape, although other shapes may be used. Each vertical semiconductor pillar 310 has along axis perpendicular to a plane of substrate 302, and is surrounded by ferroelectric gate oxide 312, which is disposed between word lines $WL_{1a}$-$WL_{4c}$, vertical semiconductor pillars 310, bit line plugs $B_{11}$-$B_{23}$, and source line plugs $S_{11}$-$S_{23}$.

In an embodiment, the ferroelectric gate oxide 312 includes an orthorhombic phase hafnium oxide layer including at least one dopant selected from Al, Zr, and/or Si. Other suitable ferroelectric materials may also be used, as such as titanate ferroelectric materials (e.g., barium titanate, lead titanate, lead zirconate titanate, lead lanthanum zirconate titanate ("PLZT"), etc.). In an embodiment, the doped hafnium oxide is in a crystalline or polycrystalline morphology. The crystal grains of the doped orthorhombic phase hafnium oxide are switched, either separately or as an ensemble, between a first polarization state (e.g., P1) to a second polarization state (e.g., P2).

Fe-FETs $M_{111a}$-$M_{232c}$ each include a portion of a corresponding one of bit line plugs $B_{11}$-$B_{23}$, a portion of a corresponding one of source line plugs $S_{11}$-$S_{23}$, and a portion of a corresponding one of word lines $WL_{1a}$ $WL_{4c}$. Each FeFETs $M_{111a}$-$M_{232c}$ also includes a channel region that includes a portion of a vertical semiconductor pillar 310.

For example, FeFET $M_{131a}$ includes a portion of bit line plug $B_{13}$ (e.g., a drain/source electrode of the FeFET), a portion of source line plug $S_{13}$ (e.g., a source/drain electrode of the FeFET) and a portion of word line $WL_{1a}$ (e.g., a gate electrode of the FeFET). FeFET $M_{131a}$ also includes a channel region that includes a portion of vertical semiconductor pillar 310 disposed between bit line plug $B_{13}$ and source line plug $S_{13}$ and adjacent word line $WL_{1a}$.

Likewise, FeFET $M_{232a}$ includes a portion of bit line plug $B_{23}$ (e.g., a drain/source electrode of the FeFET), a portion of source line plug $S_{23}$ (e.g., a source/drain electrode of the FeFET), and a portion of word line $WL_{4a}$ (e.g., a gate electrode of the FeFET). FeFET $M_{232a}$ also includes a channel region that includes a portion of vertical semiconductor pillar 310 disposed between bit line plug $B_{23}$ and source line plug $S_{23}$ and adjacent word line $WL_{4a}$.

Similarly, memory element $M_{231a}$ includes a portion of bit line plug $B_{23}$ (e.g., a drain/source electrode of the FeFET), a portion of source line plug S2 (e.g., a source/drain electrode of the FeFET), and a portion of word line $WL_{3a}$ (e.g., a gate electrode of the FeFET). FeFET $M_{231a}$ also includes a channel region that includes a portion of vertical semiconductor pillar 310 disposed between bit line plug $B_{23}$ and source line plug $S_{23}$ and adjacent word line $WL_{3a}$.

Likewise, memory element $M_{211a}$ includes a portion of bit line plug $B_{21}$ (e.g., a drain/source electrode of the FeFET), a portion of source line plug $S_{21}$ (e.g., a source/drain electrode of the FeFET), and a portion of word line $WL_{3a}$ (e.g., a gate electrode of the FeFET). FeFET $M_{211a}$ also includes a channel region that includes a portion of vertical semiconductor pillar 310 disposed between bit line plug $B_{21}$ and source line plug $S_{21}$ and adjacent word line $WL_{3a}$.

Similarly, memory element $M_{212a}$ includes a portion of bit line plug $B_{21}$ (e.g., a drain/source electrode of the FeFET), a portion of source line plug $S_{21}$ (e.g., a source/drain electrode of the FeFET), and a portion of word line $WL_{4a}$ (e.g., a gate electrode of the FeFET). FeFET $M_{212a}$ also includes a channel region that includes a portion of vertical semiconductor pillar 310 disposed between bit line plug $B_{21}$ and source line plug $S_{21}$ and adjacent word line $WL_{4a}$.

Without wanting to be bound by any particular theory, it is believed that monolithic three-dimensional memory array 300 of FIGS. 3A-3D may be used to form a compact memory array including FeFETs. In addition, a stackable memory may be achieved by vertically stacking layers of monolithic three-dimensional memory arrays, such as monolithic three-dimensional memory array 300 of FIGS. 3A-3D.

Referring now to FIGS. 4A1-4I3, an example method of forming a portion of a monolithic three-dimensional memory array, such as monolithic three-dimensional array 300 of FIGS. 3A-3D, is described.

With reference to FIGS. 4A1-4A3, substrate 302 is shown as having already undergone several processing steps. Substrate 302 may be any suitable substrate such as a silicon, germanium, silicon-germanium, undoped, doped, bulk, silicon-on-insulator ("SOI") or other substrate with or without additional circuitry. For example, substrate 302 may include one or more n-well or p-well regions (not shown). Isolation layer 304 is formed above substrate 302. In some embodiments, isolation layer 304 may be a layer of silicon dioxide, silicon nitride, silicon oxynitride or any other suitable insulating layer.

Following formation of isolation layer 304, alternating layers of first dielectric material 306 (e.g., between about 0.5 nm to about 10 nm of $SiO_2$) and a conductive material 400 are deposited over isolation layer 304. Although four layers of first dielectric material 306 and three layers of conductive material 400 are shown in FIGS. 4A1-4A3, persons of ordinary skill in the art will understand that more or fewer than four layers of first dielectric material 306 and more or fewer than three layers of conductive material 400 may be used.

Conductive material layer 400 may include any suitable conductive material such as tungsten or another appropriate metal, heavily doped semiconductor material, a conductive silicide, a conductive silicide-germanide, a conductive germanide, or the like deposited by any suitable method (e.g., CVD, PVD, etc.). In at least one embodiment, conductive material layer 400 may be between about 20 and about 250 nm of tungsten. Other conductive material layers and/or thicknesses may be used. In some embodiments, an adhesion layer (not shown), such as titanium nitride or other similar adhesion layer material, may be disposed between each first dielectric material layer 306 and conductive material layer 400, and/or between each conductive material layer 400 and subsequent material layers.

Persons of ordinary skill in the art will understand that adhesion layers may be formed by PVD or another method on conductive material layers. For example, adhesion layers may be between about 2 and about 50 nm, and in some embodiments about 10 nm, of titanium nitride or another suitable adhesion layer such as tantalum nitride, tungsten nitride, tungsten, molybdenum, combinations of one or more adhesion layers, or the like. Other adhesion layer materials and/or thicknesses may be employed.

The alternating layers of first dielectric material 306 and conductive material 400 are then patterned and etched. For example, the layers of first dielectric material 306 and conductive material 400 may be patterned and etched using conventional lithography techniques, with a soft or hard mask, and wet or dry etch processing.

In at least one embodiment, the layers of first dielectric material 306 and conductive material 400 are patterned and etched to form rows 402 separated by voids 404, resulting in the structure shown in FIGS. 4B1-4B3. Rows 402 include word lines $WL_{1a}$-$WL_{4c}$, separated from one another by first dielectric material 306. Example widths for word lines $WL_{1a}$-$WL_{4c}$ and/or voids 404 range between about 38 nm and about 100 nm, although other widths may be used.

The alternating layers of first dielectric material 306 and conductive material 400 may be patterned and etched in a single pattern/etch procedure or using separate pattern/etch steps. Any suitable masking and etching process may be used to form rows 402. In some embodiments, after etching, rows 402 may be cleaned using a dilute hydrofluoric/sulfuric acid clean. Such cleaning may be performed in any suitable cleaning tool, such as a Raider tool, available from Semitool of Kalispell, Mont. Example post-etch cleaning may include using ultra-dilute sulfuric acid (e.g., about 1.0-1.8 wt %) for about 60 seconds and/or ultra-dilute hydrofluoric ("HF") acid (e.g., about 0.4-0.6 wt %) for 60 seconds. Megasonics may or may not be used. Other clean chemistries, times and/or techniques may be employed.

After word lines $WL_{1a}$-$WL_{4c}$ have been formed, a second dielectric material layer 308 is formed over substrate 302 to fill voids 404 between word line pillars 402. For example, approximately 300-700 nm of silicon dioxide may be deposited on substrate 302 and planarized using chemical mechanical polishing or an etchback process to form a planar surface 406, resulting in the structure shown in FIGS. 4C1-4C3. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

Next, second dielectric material layer 308 is etched to form voids 408 that extend down to isolation layer 304, and extend between adjacent word lines $WL_{1a}$-$WL_{4c}$, resulting in the structure shown in FIGS. 4D1-4D3. In an embodiment, voids 408 have a rectangular shape, although other shapes may be used. Each void 408 has a width $W_v$ (e.g., between about 38 nm and about 100 nm) and a length $L_v$ (e.g., between about 38 nm and about 100 nm). Other widths and lengths may be used.

A ferroelectric gate oxide material 312 is deposited conformally (e.g., by atomic layer deposition (ALD)) over substrate 302, and forms on sidewalls of voids 408. In an embodiment, ferroelectric gate oxide material 312 includes between about 0.5 nm to about 10 nm of an orthorhombic phase hafnium oxide layer including at least one dopant selected from Al, Zr, and/or Si. Other layer thicknesses may be used. Ferroelectric gate oxide material 312 may be deposited by any suitable method (e.g., CVD, PVD, etc.).

Other suitable ferroelectric materials may also be used, as such as titanate ferroelectric materials (e.g., barium titanate, lead titanate, lead zirconate titanate, lead lanthanum zirconate titanate ("PLZT"), etc.). In an embodiment, the doped hafnium oxide is in a crystalline or polycrystalline morphology. The crystal grains of the doped orthorhombic phase hafnium oxide are switched, either separately or as an ensemble, between a first polarization state (e.g., P1) to a second polarization state (e.g., P2).

Following formation of ferroelectric gate oxide material 312, vertical semiconductor pillars 310 of Fe-FETs $M_{111a}$-$M_{232c}$ are formed over substrate 302, filling the remaining space in voids 408, resulting in the structure shown in FIGS. 4E1-4E3. In some embodiments, each vertical semiconductor pillar 310 is formed from a polycrystalline semiconductor material such as polysilicon, an epitaxial growth silicon, a polycrystalline silicon-germanium alloy, polygermanium or any other suitable material. Alternatively, vertical semiconductor pillar 310 may be formed from a wide band-gap semiconductor material, such as ZnO, InGaZnO, or SiC, which may provide a high breakdown voltage, and typically may be used to provide junctionless FETs. Persons of ordinary skill in the art will understand that other materials may be used. Vertical semiconductor pillars 310 may be deposited by any suitable method (e.g., CVD, PVD, etc.).

In some embodiments, vertical semiconductor pillars 310 may include p-type polysilicon. P-type silicon may be either deposited and doped by ion implantation or may be doped in situ during deposition to form vertical semiconductor pillars 310. For example, an intrinsic silicon layer may be, and a blanket p-type implant may be employed to implant boron a predetermined depth within the intrinsic silicon layer. Example implantable molecular ions include $BF_2$, $BF_3$, B and the like. In some embodiments, an implant dose of about $1$-$10 \times 10^{13}$ ions/cm$^2$ may be employed. Other implant species and/or doses may be used. Further, in some embodiments, a diffusion process may be employed. In an embodiment, the resultant p-type silicon vertical semiconductor pillars 310 each have a thickness of from about 80 to about 400 nm, although other p-type silicon layer sizes may be used.

Next, vertical semiconductor pillars 310 are patterned and etched to form first holes 410 that extend down to isolation layer 304, and extend between adjacent word lines $WL_{1a}$-$WL_{4c}$, resulting in the structure shown in FIGS. 4F1-4F3. In an embodiment, first holes 410 have a rectangular shape, although other shapes may be used. Each first hole 410 has a width $W_v$ (e.g., between about 38 nm and about 100 nm) and a length $L_h$ (e.g., between about 38 nm and about 100 nm). Other widths and lengths may be used.

A heavily doped n+ polysilicon layer 412 is deposited over substrate 302, filling first holes 410, forming vertical bit line plugs $B_{11}$-$B_{23}$, resulting in the structure shown in FIGS. 4G1-4G3. In some embodiments, n+ polysilicon layer 412 is in an amorphous state as deposited. In other embodiments, n+ polysilicon layer 412 is in a polycrystalline state as deposited. CVD or another suitable process may be employed to deposit n+ polysilicon layer 412.

In an embodiment, n+ polysilicon layer 412 may be formed, for example, from about 10 to about 50 nm, of phosphorus or arsenic doped silicon having a doping concentration of about $10^{21}$ cm$^{-3}$. Other layer thicknesses, doping types and/or doping concentrations may be used. N+ polysilicon layer 412 may be doped in situ, for example, by flowing a donor gas during deposition. Other doping methods may be used (e.g., implantation).

Next, vertical semiconductor pillars 310 are patterned and etched to form second holes 414 that extend down to isolation layer 304, and extend between adjacent word lines $WL_{1a}$-$WL_{4c}$, resulting in the structure shown in FIGS. 4H1-4H3. In an embodiment, second holes 414 have a rectangular shape, although other shapes may be used. Each second holes 414 has a width $W_v$ (e.g., between about 38 nm and about 100 nm) and a length $L_h$ (e.g., between about 38 nm and about 100 nm). Other widths and lengths may be used.

A heavily doped n+ polysilicon layer 416 is deposited over substrate 302, filling second holes 414, forming vertical source line plugs $S_{11}$-$S_{23}$, resulting in the structure shown in FIGS. 4I1-4I3. In some embodiments, n+ polysilicon layer 416 is in an amorphous state as deposited. In other embodiments, n+ polysilicon layer 416 is in a polycrystalline state as deposited. CVD or another suitable process may be employed to deposit n+ polysilicon layer 416.

In an embodiment, n+ polysilicon layer 416 may be formed, for example, from about 10 to about 50 nm, of phosphorus or arsenic doped silicon having a doping concentration of about $10^{21}$ cm$^{-3}$. Other layer thicknesses, doping types and/or doping concentrations may be used. N+ polysilicon layer 416 may be doped in situ, for example, by flowing a donor gas during deposition. Other doping methods may be used (e.g., implantation). Alternatively, vertical source line plugs $S_{11}$-$S_{23}$ may be formed of heavily doped p+ polysilicon.

Thus, as described above, one embodiment includes a memory element that includes a portion of a bit line plug, a portion of a source line plug, a portion of a word line, a portion of a vertical semiconductor pillar disposed between the bit line plug, the source line plug and adjacent the word line, and a gate oxide including a ferroelectric material disposed between the vertical semiconductor pillar and the word line.

One embodiment includes a memory array including a plurality of bit line plugs disposed in parallel along a first axis, a plurality of source line plugs disposed in parallel along the first axis, a plurality of word lines disposed in parallel substantially perpendicular to the first axis, a plurality of vertical semiconductor pillars, a plurality of memory elements, each memory element comprising a portion of a corresponding bit line plug, a portion of a corresponding source line plug, a portion of a corresponding word line, a portion of a corresponding vertical semiconductor pillar, and a gate oxide including a ferroelectric material.

One embodiment includes a monolithic three-dimensional memory array including a first memory level disposed above a substrate, and a second memory level disposed above the first memory level. The first memory level includes a first ferroelectric field-effect transistor including a first portion of a bit line plug, a first portion of a source line plug, a portion of a first word line, a first portion of a vertical semiconductor pillar, and a first gate oxide including a ferroelectric material disposed between the vertical semiconductor pillar and the first word line. The second memory level includes a second ferroelectric field-effect transistor including a second portion of the bit line plug, a second portion of the source line plug, a portion of a second word line, a second portion of a vertical semiconductor pillar, and a second gate oxide including the ferroelectric material disposed between the vertical semiconductor pillar and the second word line.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application, to thereby enable others skilled in the art to best utilize the technology in various embodiments and with various modifications as are suited to the particular use contemplated. The scope of the technology is defined by the claims appended hereto.

The invention claimed is:

1. A memory element comprising:
   a portion of a bit line plug;
   a portion of a source line plug;
   a portion of a word line;
   a portion of a vertical semiconductor pillar disposed between the portion of the bit line plug, the portion of the source line plug and adjacent the portion of the word line; and
   a gate oxide including a ferroelectric material disposed between the vertical semiconductor pillar and the word line,
   wherein:
      the bit line plug has a long axis that extends substantially an entire length of a long axis of the vertical semiconductor pillar; and
      the source line plug has a long axis that extends substantially the entire length of the long axis of the vertical semiconductor pillar.

2. The memory element of claim 1, wherein the gate oxide comprises a crystalline material that exhibits spontaneous electrical polarization in the absence of an external electric field.

3. The memory element of claim 1, wherein the gate oxide comprises an orthorhombic phase hafnium oxide layer including at least one dopant selected from Al, Zr, and/or Si.

4. The memory element of claim 1, wherein the gate oxide comprises a titanate ferroelectric material.

5. The memory element of claim 1, wherein the gate oxide comprises doped hafnium oxide is in a crystalline or polycrystalline morphology.

6. The memory element of claim 1, wherein the gate oxide comprises crystal grains of doped orthorhombic phase hafnium oxide that may be switched, either separately or as an ensemble, between a first polarization state to a second polarization state.

7. The memory element of claim 1, wherein the first memory element comprises a ferroelectric field-effect transistor.

8. The memory element of claim 1, wherein the portion of the bit line plug comprises a drain/source electrode, the portion of the source line plug comprises a source/drain electrode, and the portion of the word line comprises a gate electrode of the ferroelectric field-effect transistor.

9. The memory element of claim 1, wherein the first memory element comprises a transistor and no other circuit elements.

10. The memory element of claim 1, wherein the bit line plug is coupled to a bit line, and the source line plug is coupled to a source line.

11. A memory array comprising:
   a plurality of bit line plugs disposed in parallel along a first axis;
   a plurality of source line plugs disposed in parallel along the first axis;
   a plurality of word lines disposed in parallel substantially perpendicular to the first axis;
   a plurality of vertical semiconductor pillars; and
   a plurality of memory elements, each memory element comprising a portion of a corresponding bit line plug, a portion of a corresponding source line plug, a portion of a corresponding word line, a portion of a corresponding vertical semiconductor pillar disposed between the portion of the corresponding bit line plug, the portion of the corresponding source line plug and adjacent the portion of the corresponding word line, and a gate oxide including a ferroelectric material disposed between each of the vertical semiconductor pillars and each adjacent word line,
   wherein:
      each bit line plug has a long axis that extends substantially an entire length of a long axis of the vertical semiconductor pillars; and
      each source line plug has a long axis that extends substantially the entire length of the long axis of the vertical semiconductor pillars.

12. The memory array of claim 11, further comprising a plurality of bit lines disposed above the plurality of bit line plugs, and a plurality of source lines disposed above the plurality of source line plugs.

13. The memory array of claim 11, wherein the gate oxide comprises a crystalline material that exhibits spontaneous electrical polarization in the absence of an external electric field.

14. The memory array of claim 11, wherein the gate oxide comprises an orthorhombic phase hafnium oxide layer including at least one dopant selected from Al, Zr, and/or Si.

15. The memory array of claim 11, wherein the gate oxide comprises a titanate ferroelectric material.

16. The memory array of claim 11, wherein the gate oxide comprises crystal grains of doped orthorhombic phase hafnium oxide that may be switched, either separately or as an ensemble, between a first polarization state to a second polarization state.

17. The memory array of claim 11, wherein each memory element comprises a ferroelectric field-effect transistor.

18. The memory array of claim 11, wherein each memory element comprises a transistor and no other circuit elements.

19. A three-dimensional memory array comprising:
a first memory level disposed above a substrate, the first memory level comprising a first ferroelectric field-effect transistor comprising a first portion of a bit line plug, a first portion of a source line plug, a portion of a first word line, a first portion of a vertical semiconductor pillar disposed between the first portion of the bit line plug, the first portion of the source line plug and adjacent the portion of the first word line, and a first gate oxide including a ferroelectric material disposed between the vertical semiconductor pillar and the first word line; and
a second memory level disposed above the first memory level, the second memory level comprising a second ferroelectric field-effect transistor comprising a second portion of the bit line plug, a second portion of the source line plug, a portion of a second word line, a second portion of the vertical semiconductor pillar disposed between the second portion of the bit line plug, the second portion of the source line plug and adjacent the portion of the second word line, and a second gate oxide including the ferroelectric material disposed between the vertical semiconductor pillar and the second word line.

20. The three-dimensional memory array of claim 19, wherein the first gate oxide and the second gate oxide each comprise an orthorhombic phase hafnium oxide layer including at least one dopant selected from Al, Zr, and/or Si.

* * * * *